(12) United States Patent
Kim et al.

(10) Patent No.: US 12,354,553 B2
(45) Date of Patent: Jul. 8, 2025

(54) PIXEL CIRCUIT INCLUDING TRANSISTOR, SUB-TRANSISTORS, AND HOLD CAPACITOR

(71) Applicant: Samsung Display Co., Ltd., Yongin-Si (KR)

(72) Inventors: Sungwook Kim, Yongin-si (KR); Young-In Hwang, Yongin-si (KR); Youngwoo Park, Yongin-si (KR); Jeong-Soo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 18/393,729

(22) Filed: Dec. 22, 2023

(65) Prior Publication Data

US 2024/0242675 A1 Jul. 18, 2024

(30) Foreign Application Priority Data

Jan. 18, 2023 (KR) .................. 10-2023-0007539

(51) Int. Cl.
*G09G 3/3258* (2016.01)
*H10K 59/121* (2023.01)
*G09G 3/32* (2016.01)
*G09G 3/3208* (2016.01)
*G09G 3/3233* (2016.01)

(52) U.S. Cl.
CPC ....... *G09G 3/3258* (2013.01); *H10K 59/1213* (2023.02); *G09G 3/32* (2013.01); *G09G 3/3208* (2013.01); *G09G 3/3233* (2013.01); *G09G 2300/0426* (2013.01); *G09G 2300/043* (2013.01); *G09G 2300/0819* (2013.01); *G09G 2300/0842* (2013.01); *G09G 2310/08* (2013.01); *G09G 2320/02* (2013.01); *G09G 2320/0214* (2013.01); *G09G 2320/0233* (2013.01); *G09G 2320/0247* (2013.01)

(58) Field of Classification Search
CPC .............. G09G 3/3258; G09G 3/3233; G09G 2300/0426; G09G 2300/043; G09G 2300/0819; G09G 2300/0842; G09G 2310/08; G09G 2320/0214; G09G 2320/0233; G09G 2320/0247; G09G 3/32; G09G 3/3208; G09G 2320/02; H10K 59/1213
See application file for complete search history.

(56) References Cited

U.S. PATENT DOCUMENTS 10,930,210 B2 2/2021 Lee et al.
11,362,161 B2 6/2022 Hwang et al.
(Continued)

FOREIGN PATENT DOCUMENTS

KR 10-2020-0142638 A 12/2020
KR 10-2022-0017549 A 2/2022
KR 10-2022-0030416 A 3/2022

*Primary Examiner* — Adam J Snyder
(74) *Attorney, Agent, or Firm* — Innovation Counsel LLP

(57) ABSTRACT

A pixel circuit is disclosed that includes a first hold capacitor or a second hold capacitor or both the first and second hold capacitors. The first hold capacitor is connected to a first gate electrode of a first transistor and an intermediate node of a first sub-transistor and a second sub-transistor. The second hold capacitor is connected to the first gate electrode of the first transistor and an intermediate node of a third sub-transistor and a fourth sub-transistor.

20 Claims, 20 Drawing Sheets

(56) References Cited

U.S. PATENT DOCUMENTS

| | | | |
|---|---|---|---|
| 11,410,607 B2 | 8/2022 | Roh et al. | |
| 11,637,164 B2 | 4/2023 | Kwak et al. | |
| 2009/0201231 A1* | 8/2009 | Takahara | G09G 3/3233 |
| | | | 345/76 |
| 2012/0019501 A1* | 1/2012 | Choi | G09G 3/3233 |
| | | | 345/76 |
| 2016/0254340 A1* | 9/2016 | Kwon | H01L 27/1255 |
| | | | 257/40 |
| 2016/0372037 A1* | 12/2016 | Lim | G09G 3/3233 |
| 2018/0151650 A1* | 5/2018 | Ha | G09G 3/3233 |
| 2019/0057648 A1* | 2/2019 | Xu | G09G 3/3233 |
| 2020/0395424 A1* | 12/2020 | Hwang | G09G 3/3233 |
| 2023/0186850 A1* | 6/2023 | Wang | G09G 3/3233 |
| | | | 345/211 |

\* cited by examiner

PIXEL CIRCUIT INCLUDING TRANSISTOR, SUB-TRANSISTORS, AND HOLD CAPACITOR

This application claims priority under 35 USC § 119 to Korean Patent Application No. 10-2023-0007539 filed on Jan. 18, 2023 in the Korean Intellectual Property Office (KIPO), the entire disclosure of which is incorporated by reference herein.

BACKGROUND

1. Field

The present inventive concept relate to a pixel circuit. More particularly, the present inventive concept relate to a pixel circuit applied to various electronic devices.

2. Description of the Related Art

Generally, a display device may include a display panel and a display panel driver. The display panel may include gate lines, data lines, emission lines and pixels. The display panel driver may include a gate driver for providing gate signals to the gate lines, a data driver for providing data voltages to the data lines, an emission driver for providing emission signals to the emission lines, and a driving controller for controlling the gate driver, the data driver, and the emission driver.

The display device may display an image using light emitted from the pixels. A driving transistor included in each of the pixels may generate a driving current for displaying the image. The pixels may emit the light with luminance corresponding to the driving current flowing through the pixels. When magnitude of the driving current changes, the luminance of the image may change. When the luminance of the image changes, flicker may occur, and when the flicker is recognized, image quality of the display device may deteriorate.

SUMMARY

Embodiments of the present inventive concept may provide a pixel circuit which minimizes deterioration of display quality due to a leakage current.

In an embodiment of a pixel circuit according to the present inventive concept, the pixel circuit includes a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region, a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region, a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region, a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region, a storage capacitor including a first storage electrode electrically connected to the first gate electrode and a second storage electrode electrically connected to the first power supply voltage line, a first hold capacitor including a first hold electrode electrically connected to the first sub-source region and a second hold electrode electrically connected to the first gate electrode, and a second hold capacitor including a third hold electrode electrically connected to the third sub-source region and a fourth hold electrode electrically connected the first gate electrode.

In an embodiment, a frame period in which the pixel circuit is driven may include a threshold voltage compensating period for compensating a threshold voltage of the first transistor, and during the threshold voltage compensating period, the first sub-transistor and the second sub-transistor may be turned on in response to a second gate signal.

In an embodiment, a frame period in which the pixel circuit is driven may include an initialization period in which the first gate electrode is initialized, and during the initialization period, the third sub-transistor and the fourth sub-transistor may be turned on in response to a third gate signal.

In an embodiment, a voltage of the first gate electrode may be boosted by the first hold capacitor and the second hold capacitor.

In an embodiment, a boosting voltage of the first gate electrode may be determined by a series connection of the storage capacitor and the first hold capacitor and a series connection of the storage capacitor and the second hold capacitor.

In an embodiment, when a second gate signal applied to the first and second sub-gate electrodes increases, a voltage of the first sub-source region may increases, and when the second gate signal decreases, the voltage of the first sub-source region may decrease.

In an embodiment, when the voltage of the first sub-source region increases, a voltage of the first gate electrode may increase, and an increase amount of the voltage of the first gate electrode may be less than an increase amount of the voltage of the first sub-source region, and when the voltage of the first sub-source region decreases, the voltage of the first gate electrode may decrease, and a decrease amount of the first gate electrode may be less than an decrease amount of the voltage of the first sub-source region.

In an embodiment, when the third gate signal applied to the third and fourth sub-gate electrodes increases, a voltage of the third sub-source region may increases, and when the third gate signal decreases, the voltage of the third sub-source region may decrease.

In an embodiment, when the voltage of the third sub-source region increases, a voltage of the first gate electrode may increase, and an increase amount of the voltage of the first gate electrode may be less than an increase amount of the voltage of the third sub-source region, and when the voltage of the third sub-source region decreases, the voltage of the first gate electrode may decrease, and an decrease amount of the voltage of the first gate electrode may be less than an decrease amount of the voltage of the third sub-source region.

In an embodiment of a pixel circuit according to the present inventive concept, the pixel circuit includes a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region, a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region, a storage capacitor including a first storage electrode electrically connected to the first gate electrode and a second storage electrode electrically connected to the first power supply voltage line, and a first hold capacitor including a first hold electrode electrically connected to the first sub-source region and a second hold electrode electrically connected to the first gate electrode.

In an embodiment, a frame period in which the pixel circuit is driven may include a threshold voltage compensating period for compensating a threshold voltage of the first transistor, and during the threshold voltage compensating period, the first sub-transistor and the second sub-transistor may be turned on in response to a second gate signal.

In an embodiment, a voltage of the first gate electrode may be boosted by the first hold capacitor.

In an embodiment, a boosting voltage of the first gate electrode may be determined by a series connection of the storage capacitor and the first hold capacitor.

In an embodiment, when a second gate signal applied to the first and second sub-gate electrodes increases, a voltage of the first sub-source region may increase, and when the second gate signal decreases, the voltage of the first sub-source region may decrease.

In an embodiment, when the voltage of the first sub-source region increases, a voltage of the first gate electrode may increase, and an increase amount of the voltage of the first gate electrode may be less than an increase amount of the voltage of the first sub-source region, and when the voltage of the first sub-source region decreases, the voltage of the first gate electrode may decrease, and a decrease amount of the first gate electrode may be less than an decrease amount of the voltage of the first sub-source region.

In an embodiment of a pixel circuit according to the present inventive concept, the pixel circuit includes a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region, a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region, a storage capacitor including a second storage electrode electrically connected to the first gate electrode and a second storage electrode electrically connected to the first power supply voltage line, and a second hold capacitor including a third hold electrode electrically connected to the third sub-source region and a fourth hold electrode electrically connected the first gate electrode.

In an embodiment, a frame period in which the pixel circuit is driven may include an initialization period in which the first gate electrode is initialized, and during the initialization period, the third sub-transistor and the fourth sub-transistor may be turned on in response to a third gate signal.

In an embodiment, a voltage of the first gate electrode may be boosted by the second hold capacitor.

In an embodiment, a boosting voltage of the first gate electrode may be determined by a series connection of the storage capacitor and the second hold capacitor.

In an embodiment, when the third gate signal applied to the third and fourth sub-gate electrodes increases, a voltage of the third sub-source region increases, a voltage of the first gate electrode may increase, and an increase amount of the voltage of the first gate electrode may be less than an increase amount of the voltage of the third sub-source region, and when the third gate signal decreases, the voltage of the third sub-source region may decrease, the voltage of the first gate electrode may decrease, and an decrease amount of the voltage of the first gate electrode may be less than an decrease amount of the voltage of the third sub-source region.

According to the pixel circuit according to the embodiments, the pixel circuit may include a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region, a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region, a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region, a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region, a storage capacitor including a first storage electrode electrically connected to the first gate electrode and a second storage electrode electrically connected to the first power supply voltage line, a first hold capacitor including a first hold electrode electrically connected to the first sub-source region and a second hold electrode electrically connected to the first gate electrode, and a second hold capacitor including a third hold electrode electrically connected to the third sub-source region and a fourth hold electrode electrically connected the first gate electrode. Accordingly, an image may be displayed with more uniform luminance, and the display quality may be improved.

According to the pixel circuit according to the embodiments, the pixel circuit may include a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region, a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region, a storage capacitor including a first storage electrode electrically connected to the first gate electrode and a second storage electrode electrically connected to the first power supply voltage line, and a first hold capacitor including a first hold electrode electrically connected to the first sub-source region and a second hold electrode electrically connected to the first gate electrode. Accordingly, an image may be displayed with more uniform luminance, and the display quality may be improved.

According to the pixel circuit according to the embodiments, the pixel circuit may include a light emitting element including an anode and a cathode, a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region, a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region, a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region, a storage capacitor including a second storage electrode electrically connected to the first gate electrode and a second storage electrode electrically connected to the first power supply voltage line, and a second hold capacitor including a third hold electrode electrically connected to the third sub-source region and a fourth hold electrode electrically connected the first gate electrode. Accordingly, an image may be displayed with more uniform luminance, and the display quality may be improved.

BRIEF DESCRIPTION OF THE DRAWINGS

The above and other features of embodiments of the present inventive concept will become more apparent by describing in detailed embodiments thereof with reference to the accompanying drawings, in which:

FIG. 2I is a plan view for illustrating a third conductive layer included in the pixel circuit in FIG. 2E;

DETAILED DESCRIPTION OF THE EMBODIMENTS

Hereinafter, embodiments of the present inventive concept will be described in detail with reference to the accompanying drawings.

Figure 1:
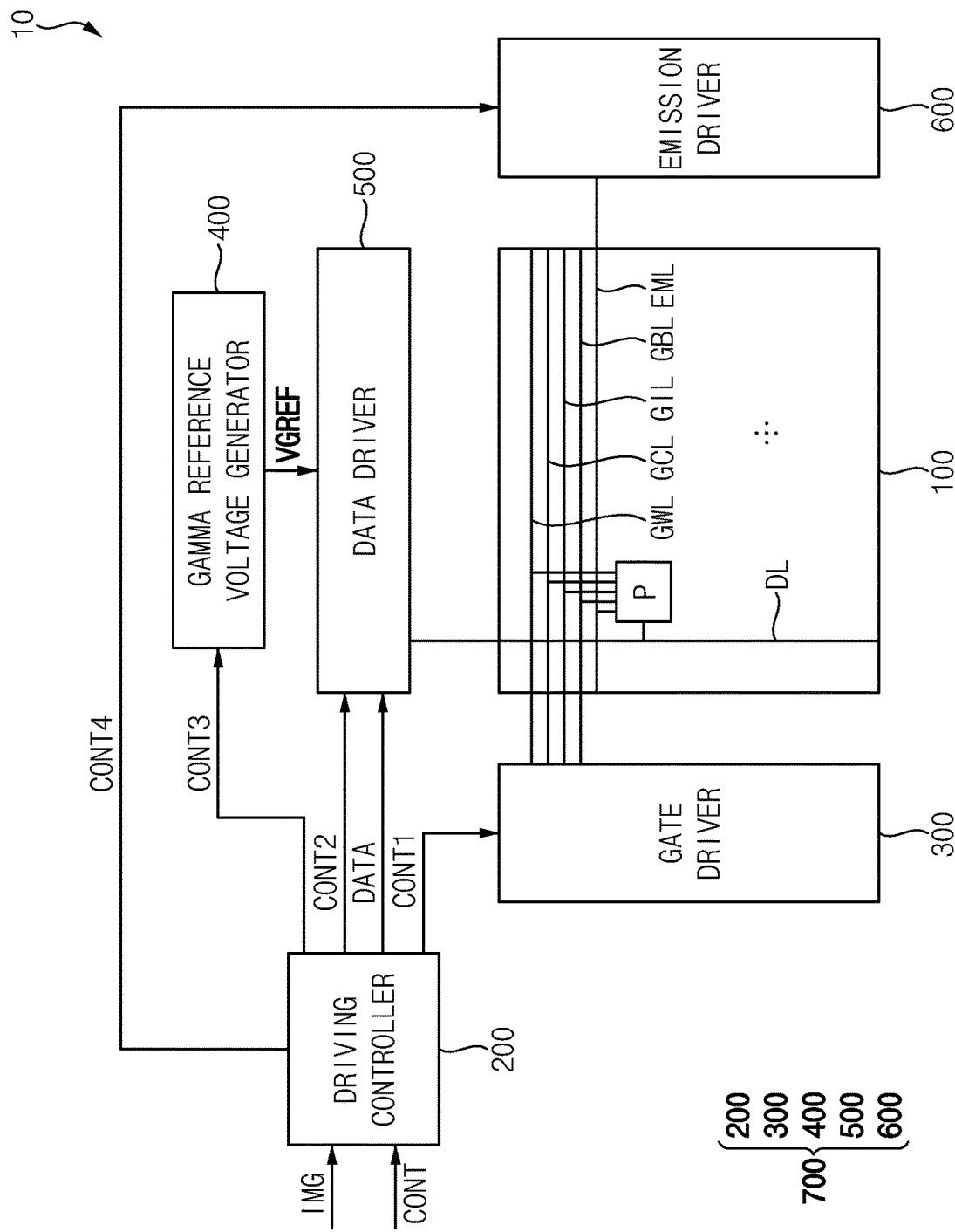
FIG. 1 is a block diagram for illustrating a display device according to embodiments of the present inventive concept.

FIG. 1 is a block diagram for illustrating a display device 10 according to embodiments of the present inventive concept.

Referring to FIG. 1, a display device 10 may include a display panel 100 and a display panel driver 700. The display panel driver 700 may include a driving controller 200, a gate driver 300, a gamma reference voltage generator 400, a data driver 500, and an emission driver 600.

For example, the driving controller 200 and the data driver 500 may be integrally formed. For example, the driving controller 200, the gamma reference voltage generator 400, and the data driver 500 may be integrally formed. For example, the driving controller 200, the gate driver 300, the gamma reference voltage generator 400, and the data driver 500 may be integrally formed. For example, the driving controller 200, the gate driver 300, the gamma reference voltage generator 400, the data driver 500, and the emission driver 600 may be integrally formed. A driving module including at least the driving controller 200 and the data driver 500 which are integrally formed may be referred to as a timing controller embedded data driver (TED).

The display panel 100 may include a display region displaying an image and a peripheral region disposed adjacent to the display region.

For example, the display panel 100 may be an organic light emitting diode display panel including organic light emitting diodes. For example, the display panel 100 may be a quantum-dot organic light emitting diode display panel including organic light emitting diodes and quantum-dot color filters. For example, the display panel 100 may be a quantum-dot nano light emitting diode display panel including nano light emitting diodes and quantum-dot color filters.

The display panel 100 may include gate lines GWL, GCL, GIL, and GBL, data lines DL, emission lines EML, and pixels P electrically connected to the gate lines GWL, GCL, GIL, and GBL, the data lines DL, and the emission lines EML.

The driving controller 200 may receive input image data IMG and an input control signal CONT from an external device. For example, the input image data IMG may include red image data, green image data, and blue image data. The input image data IMG may further include white image data. The input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, a fourth control signal CONT4, and a data signal DATA based on the input image data IMG and the input control signal CONT.

The driving controller 200 may generate the first control signal CONT1 for controlling an operation of the gate driver 300 based on the input control signal CONT, and output the first control signal CONT1 to the gate driver 300. The first control signal CONT1 may include a vertical start signal and a gate clock signal.

The driving controller 200 may generate the second control signal CONT2 for controlling an operation of the data driver 500 based on the input control signal CONT, and output the second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the third control signal CONT3 for controlling an operation of the gamma reference voltage generator 400 based on the input control signal CONT, and output the third control signal CONT3 to the gamma reference voltage generator 400.

The driving controller 200 may generate the fourth control signal CONT4 for controlling an operation of the emission driver 600 based on the input control signal CONT, and output the fourth control signal CONT4 to the emission driver 600.

The gate driver 300 may generate gate signals for driving the gate lines GWL, GCL, GIL, and GBL in response to the first control signal CONT1 received from the driving controller 200. The gate driver 300 may output the gate signals to the gate lines GWL, GCL, GIL, and GBL.

In an embodiment, the gate driver 300 may be integrated on the peripheral region of the display panel 100.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to each data signal DATA.

In an embodiment, the gamma reference voltage generator 400 may be disposed in the drive controller 200 or the data driver 500.

The data driver 500 may receive the second control signal CONT2 and the data signal DATA from the driving controller 200 and receive the gamma reference voltage VGREF from the gamma reference voltage generator 400. The data driver 500 may convert the data signal DATA into a data voltage in analog form. The data driver 500 may output the data voltage to the data line DL.

The emission driver 600 may generate emission signals for driving the emission lines EML in response to the fourth control signal CONT4 received from the driving controller 200. The emission driver 600 may output the emission signals to the emission lines EML.

Figure 2A:
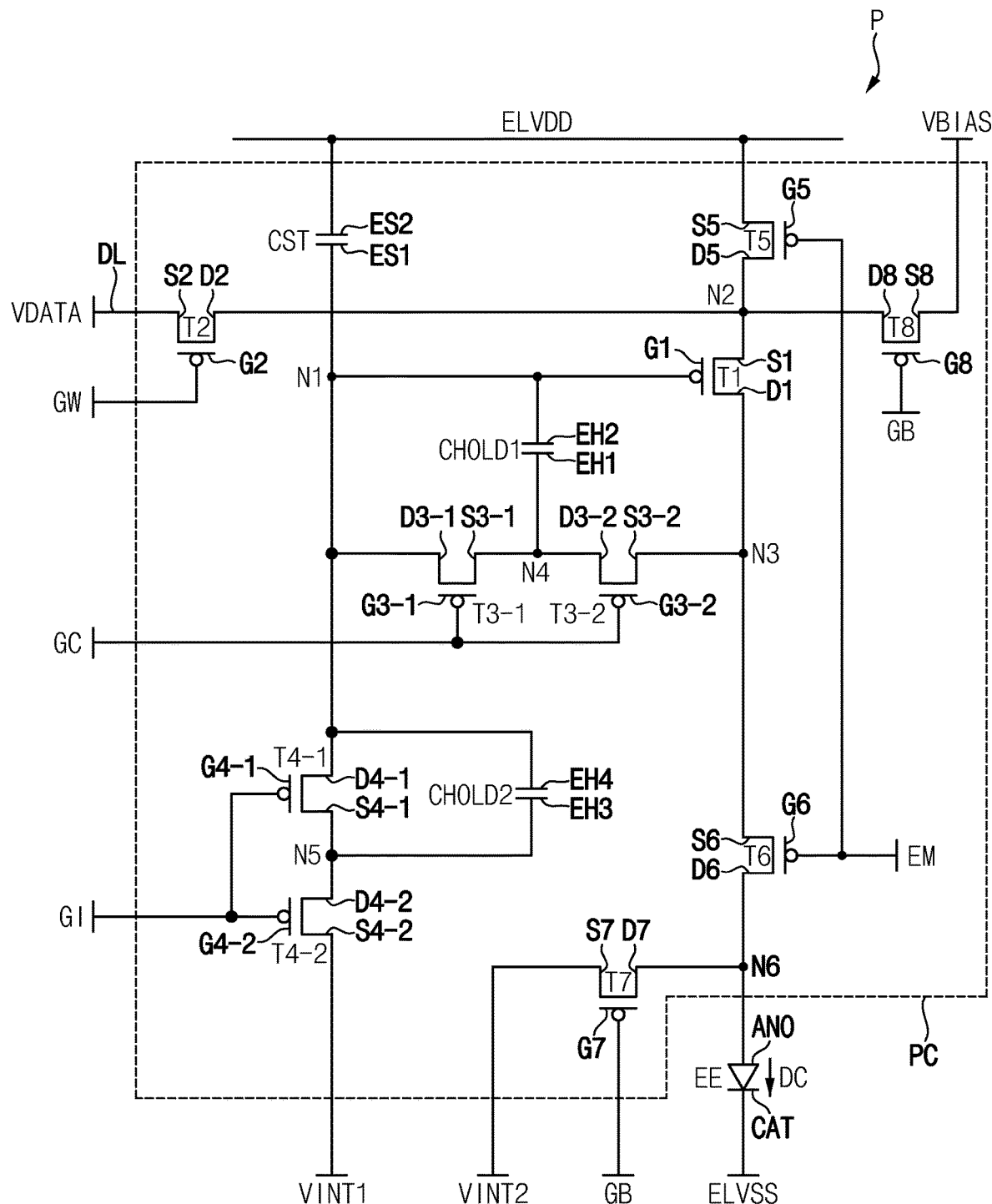
FIG. 2A is a circuit diagram for illustrating an example of a pixel included in the display device in FIG. 1.
Figure 2B:
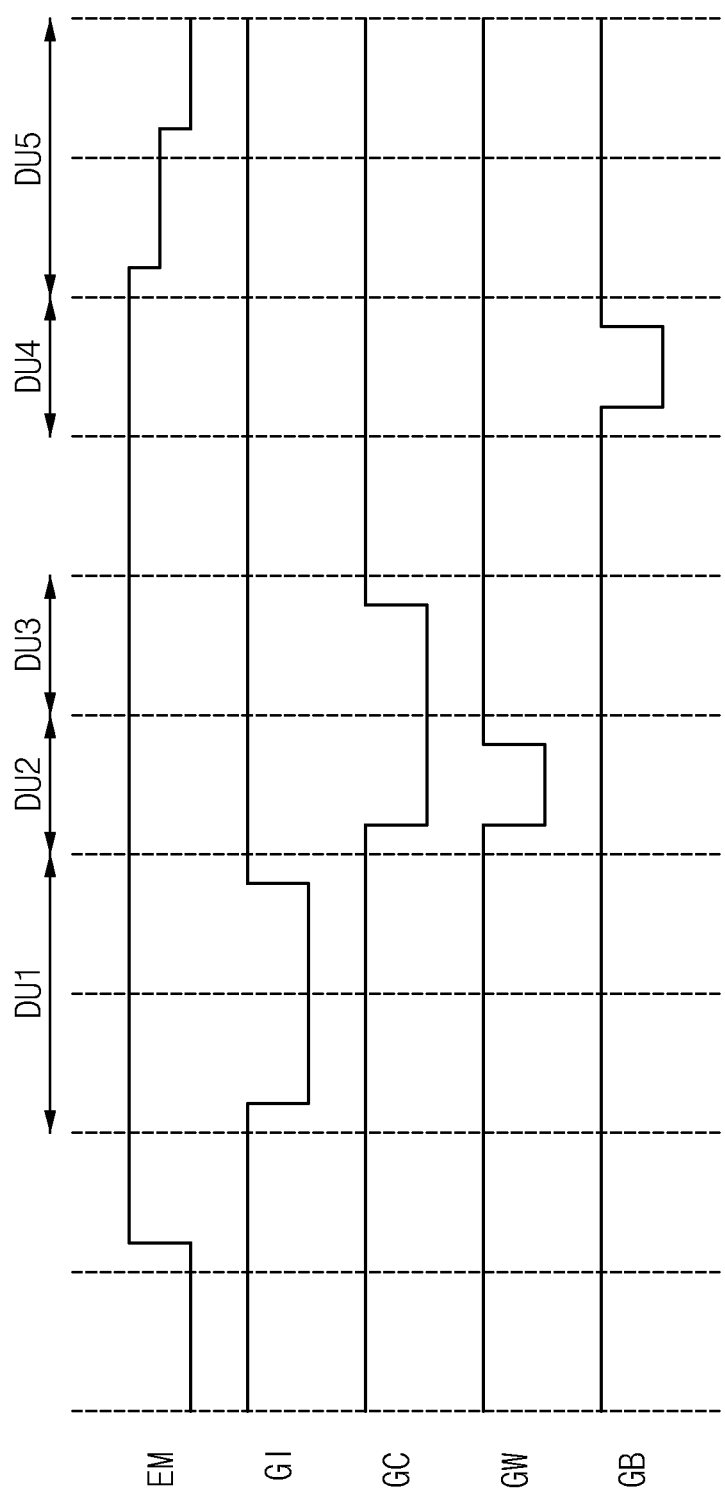
FIG. 2B is a timing diagram for illustrating an operation of the pixel in FIG. 2A.
Figure 2C:
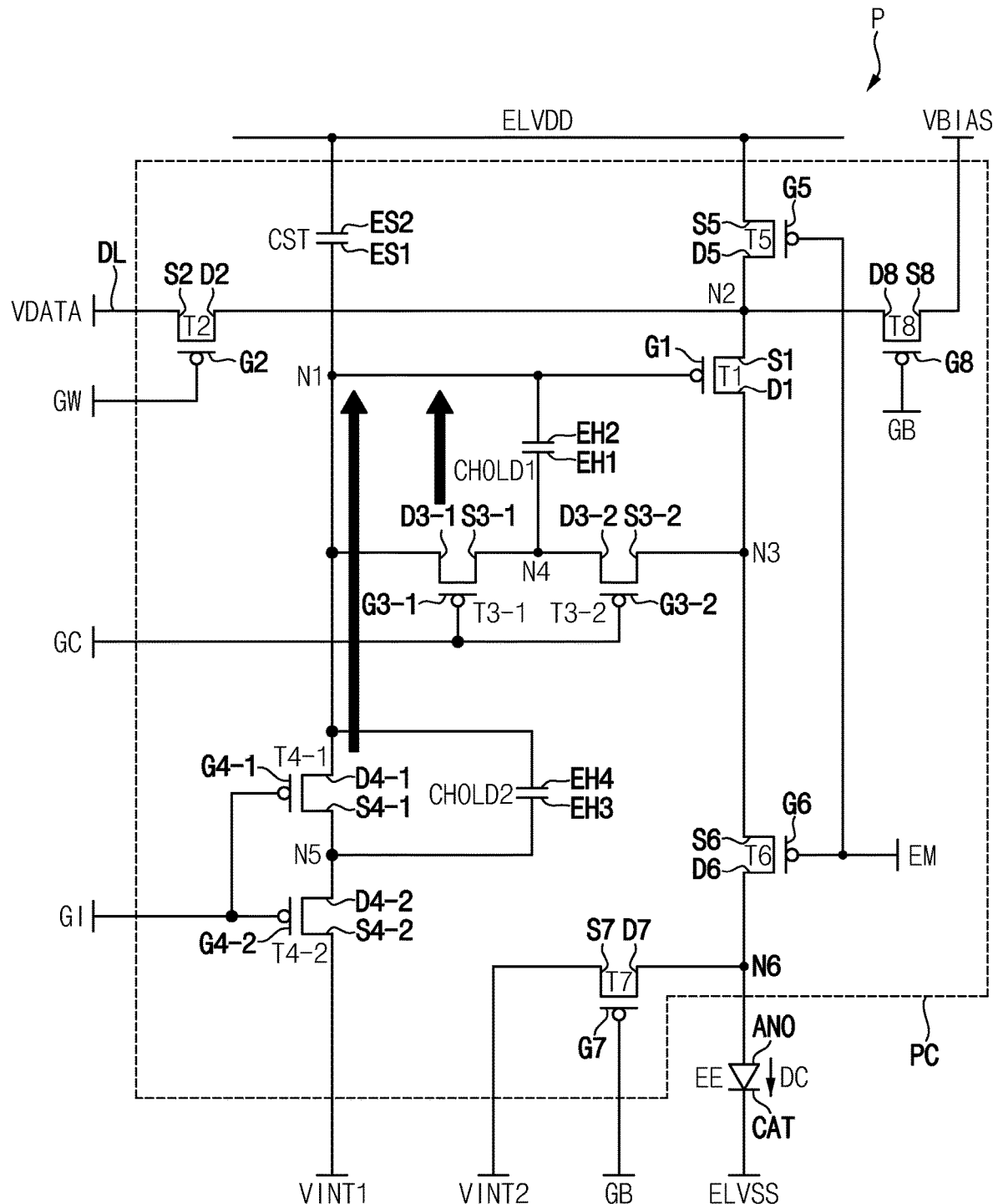
FIGS. 2C and 2D are circuit diagrams for illustrating an operation of the pixel in the FIG. 2A.
Figure 2D:
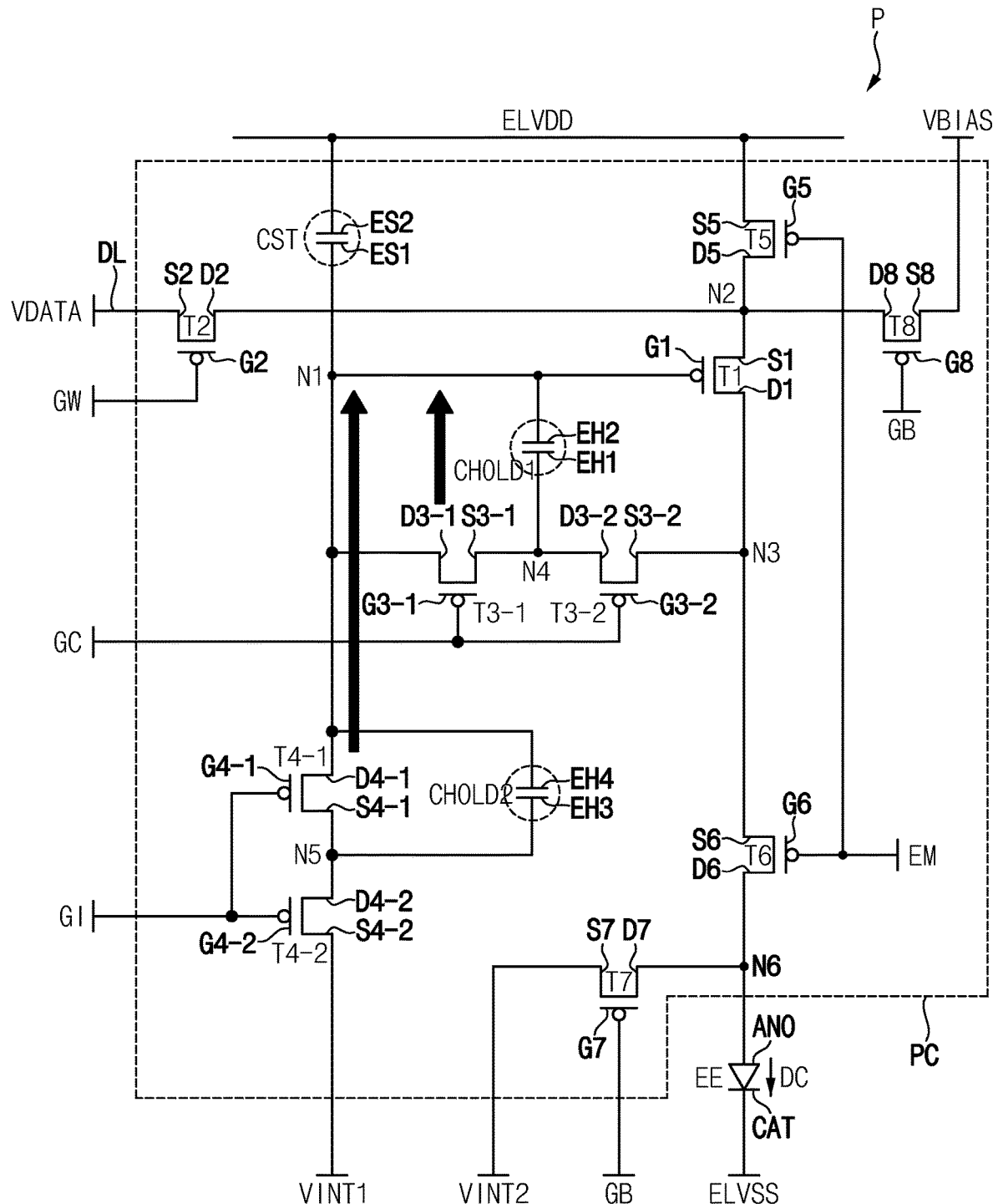

FIG. 2A is a circuit diagram for illustrating an example of a pixel P included in the display device 10 in FIG. 1. FIG. 2B is a timing diagram for illustrating an operation of the pixel P in FIG. 2A. FIGS. 2C and 2D are circuit diagrams for illustrating an operation of the pixel P in the FIG. 2A.

Referring to FIGS. 1 to 2D, the display panel 100 may include the pixels P, and each of the pixels P may include a light emitting element EE and a pixel circuit PC.

The light emitting element EE may emit light based on a driving current DC. The light emitting element EE may include an anode ANO and a cathode CAT. The anode ANO may be connected to the pixel circuit PC. The cathode CAT may be connected to a second power supply voltage line which transfers a second power supply voltage ELVSS.

The pixel circuit PC may control light emission of the light emitting element EE. The pixel circuit PC may provide the driving current DC to the light emitting element EE. The pixel circuit PC may include a plurality of transistors and at least one capacitor. In an embodiment, the pixel circuit PC may include a first transistor T1, a second transistor T2, a third transistor T3, a fourth transistor T4, a fifth transistor T5, a sixth transistor T6, a seventh transistor T7, an eighth transistor T8, a first hold capacitor CHOLD1, a second hold capacitor CHOLD2, and a storage capacitor CST.

The first transistor T1 may include a first source electrode S1, a first drain electrode D1, and a first gate electrode G1. The first source electrode S1 may be connected to a second node N2. The first drain electrode D1 may be connected to a third node N3. The first gate electrode G1 may be connected to a first node N1. The first transistor T1 may generate the driving current DC based on a voltage between the second node N2 and the first node N1.

The second transistor T2 may include a second source electrode S2, a second drain electrode D2, and a second gate electrode G2. The second source electrode S2 may be connected to the data line DL. The second drain electrode D2 may be connected to the second node N2. The second gate electrode G2 may be connected to a first gate line which transfers a first gate signal GW. The second transistor T2 may apply the data voltage VDATA to the second node N2 in response to the first gate signal GW.

The third transistor T3 may include a first sub-transistor T3-1 and a second sub-transistor T3-2. The third transistor T3 may have a dual gate structure including two gate electrodes. The first sub-transistor T3-1 may include a first sub-source electrode S3-1, a first sub-drain electrode D3-1, and a first sub-gate electrode G3-1. The first sub-source electrode S3-1 may be connected to a fourth node N4. The first sub-drain electrode D3-1 may be connected to the first node N1. The first sub-gate electrode G3-1 may be connected to a second gate line which transfers a second gate signal GC. The second sub-transistor T3-2 may include a second sub-source electrode S3-2, a second sub-drain electrode D3-2, and a second sub-gate electrode G3-2. The second sub-source electrode S3-2 may be connected to the third node N3. The second sub-drain electrode D3-2 may be connected to the fourth node N4. The second sub-gate electrode G3-2 may be connected to the second gate line. The third transistor T3 may diode-connect the first drain electrode D1 and the first gate electrode G1 of the first transistor T1 in response to the second gate signal GC.

The fourth transistor T4 may include a third sub-transistor T4-1 and a fourth sub-transistor T4-2. The fourth transistor T4 may have the dual gate structure including two gate electrodes. The third sub-transistor T4-1 may include a third sub-source electrode S4-1, a third sub-drain electrode D4-1, and a third sub-gate electrode G4-1. The fourth sub-transistor T4-2 may include a fourth sub-source electrode S4-2, a fourth sub-drain electrode D4-2, and a fourth sub-gate electrode G4-2. The third sub-source electrode S4-1 may be connected to a fifth node N5. The third sub-drain electrode D4-1 may be connected to the first node N1. The third sub-gate electrode G4-1 may be connected to a third gate line which transfers a third gate signal GI. The fourth sub-source electrode S4-2 may be connected to a first initialization voltage line which transfers a first initialization voltage VINT1. The fourth sub-drain electrode D4-2 may be connected to the fifth node N5. The fourth sub-gate electrode G4-2 may be connected to the third gate line. The fourth transistor T4 may initialize the first gate electrode G1 of the first transistor T1 with the first initialization voltage VINT1 in response to the third gate signal GI.

The fifth transistor T5 may include a fifth source electrode S5, a fifth drain electrode D5, and a fifth gate electrode G5. The fifth source electrode S5 may be connected to a first power supply voltage line which transfers a first power supply voltage ELVDD. In an embodiment, the first power supply voltage ELVDD may be higher than the second power supply voltage ELVSS. The fifth drain electrode D5 may be connected to the second node N2. The fifth gate electrode G5 may be connected to the emission line EML which transfers the emission signal EM. The fifth transistor T5 may connect the first power supply voltage line and the second node N2 in response to the emission signal EM.

The sixth transistor T6 may include a sixth source electrode S6, a sixth drain electrode D6, and a sixth gate electrode G6. The sixth source electrode S6 may be connected to the third node N3. The sixth drain electrode D6 may be connected to a sixth node N6. The sixth gate electrode G6 may be connected to the emission line EML. The sixth transistor T6 may connect the third node N3 and the anode ANO of the light emitting element EE in response to the emission signal EM.

The seventh transistor T7 may include a seventh source electrode S7, a seventh drain electrode D7, and a seventh gate electrode G7. The seventh source electrode S7 may be connected to a second initialization voltage line which transfers a second initialization voltage VINT2. The seventh drain electrode D7 may be connected to the sixth node N6. The seventh gate electrode G7 may be connected to a fourth gate line which transfers a fourth gate signal GB. The seventh transistor T7 may initialize the anode ANO of the light emitting element EE with the second initialization voltage VINT2 in response to the fourth gate signal GB.

The eighth transistor T8 may include an eighth source electrode S8, an eighth drain electrode D8, and an eighth gate electrode G8. The eighth source electrode S8 may be connected to a bias voltage line which transfers a bias voltage VBIAS. The eighth drain electrode D8 may be connected to the second node N2. The eighth gate electrode G8 may be connected to the fourth gate line. The eighth transistor T8 may on-bias the first transistor T1 with the bias voltage VBIAS in response to the fourth gate signal GB.

In an embodiment, the first transistor T1, the second transistor T2, the third transistor T3, the fourth transistor T4, the fifth transistor T5, the sixth transistor T6, the seventh transistor T7, and the eighth transistor T8 each may be a P-type transistor (e.g., a PMOS transistor). In another embodiment, at least one of the first transistor T1, the second transistor T2, the third transistor T3, the fourth transistor T4, the fifth transistor T5, the sixth transistor T6, and the seventh transistor T6, the transistor T7, and the eighth transistor T8 may be an N-type transistor (e.g., an NMOS transistor).

The storage capacitor CST may include a first storage electrode ES1 and a second storage electrode ES2. The first storage electrode ES1 may be connected to the first node N1. The second storage electrode ES2 may be connected to the first power supply voltage line. The storage capacitor CST may store a voltage of the first gate electrode G1 of the first transistor T1.

The first hold capacitor CHOLD1 may include a first hold electrode EH1 and a second hold electrode EH2. The first hold electrode EH1 may be connected to the fourth node N4. The second hold electrode EH2 may be connected to the first node N1.

The second hold capacitor CHOLD2 may include a third hold electrode EH3 and a fourth hold electrode EH4. The third hold electrode EH3 may be connected to the fifth node N5. The fourth hold electrode EH4 may be connected to the first node N1.

As shown in FIG. 2B, during a first period DU1, the first gate signal GW, the second gate signal GC, the fourth gate signal GB, and the emission signal EM may have an inactive level. During the first period DU1, the third gate signal GI may have an active level. During the first period DU1, the fourth transistor T4 may be turned on in response to the third gate signal GI. The first period DU1 may be an initialization period in which an initialization operation of the first gate electrode G1 is performed.

During a second period DU2 following the first period DU1, the third gate signal GI, the fourth gate signal GB, and the emission signal EM may have the inactive level. During the second period DU2, the first gate signal GW and the second gate signal GC may have the active level. The second period DU2 may be a data writing period in which the second transistor T2 performs a data writing operation.

During a third period DU3 following the second period DU2, the first gate signal GW, the third gate signal GI, the fourth gate signal GB, and the emission signal EM may have the inactive level. During the second period DU2, the second gate signal GC may have the active level. During the third period DU3, the third transistor T3 may be turned on in response to the second gate signal GC. The second period DU2 and the third period DU3 may be threshold voltage compensation periods in which the third transistor T3 performs a threshold voltage compensation operation of the first transistor T1.

During a fourth period DU4, the first gate signal GW, the second gate signal GC, the third gate signal GI, and the emission signal EM may have the inactive level. During the fourth period DU4, the fourth gate signal GB may have the active level. The fourth period DU4 may be an anode initialization period in which the seventh transistor T7 performs an anode initialization operation.

During a fifth period DU5 following the fourth period DU4, the first gate signal GW, the second gate signal GC, the third gate signal GI, and the fourth gate signal GB may have the inactive level. During the fifth period DU5, the emission signal EM may have an inactive level (an intermediate high level) and then the active level. The fifth period DU5 may be a light emitting period in which the light emitting element EE performs a light emitting operation.

In an embodiment, the display panel 100 may be driven at a variable frequency. When the display panel 100 operates in a low-frequency driving mode, a leakage current may be generated in the third transistor T3 so that luminance of the display panel 100 may undesirably decrease. As such, when the data voltage VDATA is applied to the pixel P after the luminance of the display panel 100 may undesirably be decreased, the luminance of the display panel 100 becomes bright and may be recognized as flicker.

In particular, when a voltage of the fourth node N4 in FIG. 2A is varied, a voltage of the first node N1 may be varied so that an undesirable luminance change may occur. Specifically, when the second gate signal GC increases or decreases, the voltage of the fourth node N4 may increase or decrease together. When the voltage of the fourth node N4 increases or decreases together, the leakage current is generated in the third transistor T3 due to a difference between the voltage of the first node N1 and the voltage of the fourth node N4. When the voltage of the first node N1 varies, the undesirable luminance change may occur. In addition, when a voltage of the fifth node N5 in FIG. 2A is varied, there is a problem in that the voltage of the first node N1 is varied and the undesirable luminance change occurs. When the third gate signal GI increases or decreases, the voltage of the fifth node N5 may also increase or decrease. When the voltage of the fifth node N5 increases or decreases together, the leakage current is generated in the fourth transistor T4 due to a difference between the voltage of the first node N1 and the voltage of the fifth node N5. When the voltage of the first node N1 varies, the undesirable luminance change may occur.

In order to solve this problem, in an embodiment, the pixel circuit PC may include the first hold capacitor CHOLD1 disposed between the first node N1 and an intermediate node (i.e., the fourth node N4) of the first sub-transistor T3-1 and the second sub-transistor T3-2 and the second hold capacitor CHOLD2 disposed between the first gate electrode G1 (i.e., the first node N1) of the first transistor T1 and an intermediate node (i.e., the fifth node N5) of the third sub-transistor T4-1 and the fourth sub-transistor T4-2.

A voltage of the first gate electrode G1 (i.e., the first node N1) may be boosted by the first hold capacitor CHOLD1 and the second hold capacitor CHOLD2. A boosting voltage of the first gate electrode G1 may be determined by a series connection of the storage capacitor CST and the first hold capacitor CHOLD1 and a series connection of the storage capacitor CST and the second hold capacitor CHOLD2. The boosting voltage of the first gate electrode G1 may be determined by an [Equation 1] below:

$$\Delta VN1 = \frac{C\_CHOLD1}{C\_CST + C\_CHOLD1} \times \Delta VN4 + \frac{C\_CHOLD2}{C\_CST + C\_CHOLD2} \times \Delta VN5 \quad \text{[Equation 1]}$$

Here, $\Delta VN1$ denotes the boosting voltage of the first gate electrode G1, C_CHOLD1 denotes a capacitance of the first hold capacitor CHOLD1, C_CST denotes a capacitance of the storage capacitor CST, $\Delta VN4$ denotes a variation voltage of the intermediate node of the first sub-transistor T3-1 and the second sub-transistor T3-2, and C_CHOLD2 represents a capacitance of the second hold capacitor, and $\Delta VN5$ represents a variation voltage of the intermediate node of the third sub-transistor T4-1 and the fourth sub-transistor T4-2.

When the second gate signal GC increases or decreases, the voltage of the fourth node N4 may also increase or decrease. When the voltage of the fourth node N4 increases or decreases, the voltage of the first node N1 also increases or decreases together due to voltage distribution based on the series connection of the storage capacitor CST and the first hold capacitor CHOLD1. An increase amount or decrease amount of the voltage of the first gate electrode G1 may be less than an increase amount or decrease amount of a voltage of a first sub-source region S3-1. Therefore, a difference between the voltage of the first node N1 and the voltage of the fourth node N4 may be less when the first hold capacitor CHOLD1 is present in the pixel circuit PC than when the first hold capacitor CHOLD1 is not present in the pixel circuit PC. That is, when the pixel circuit PC further includes the first hold capacitor CHOLD1, the leakage current flowing in the third transistor T3 may be decreased. Therefore, deterioration of display quality due to the leakage current may be minimized.

When the third gate signal GI increases or decreases, the voltage of the fifth node N5 may also increase or decrease. When the voltage of the fifth node N5 increases or decreases together, the voltage of the first node N1 also increases or decreases together due to voltage distribution based on the series connection of the storage capacitor CST and the second hold capacitor CHOLD2. The increase amount or decrease amount of the voltage of the first gate electrode G1 may be less than an increase amount or decrease amount of a voltage of the third sub-source region S4-1. Therefore, a difference between the voltage of the first node N1 and the voltage of the fifth node N5 may be more decreased when the second hold capacitor CHOLD2 is present in the pixel circuit PC than when the second hold capacitor CHOLD2 is not present in the pixel circuit PC. That is, when the pixel circuit PC further includes the second hold capacitor CHOLD2, the leakage current flowing in the fourth transistor T4 may be decreased. Therefore, the deterioration of the display quality due to the leakage current may be minimized.

Figure 2E:
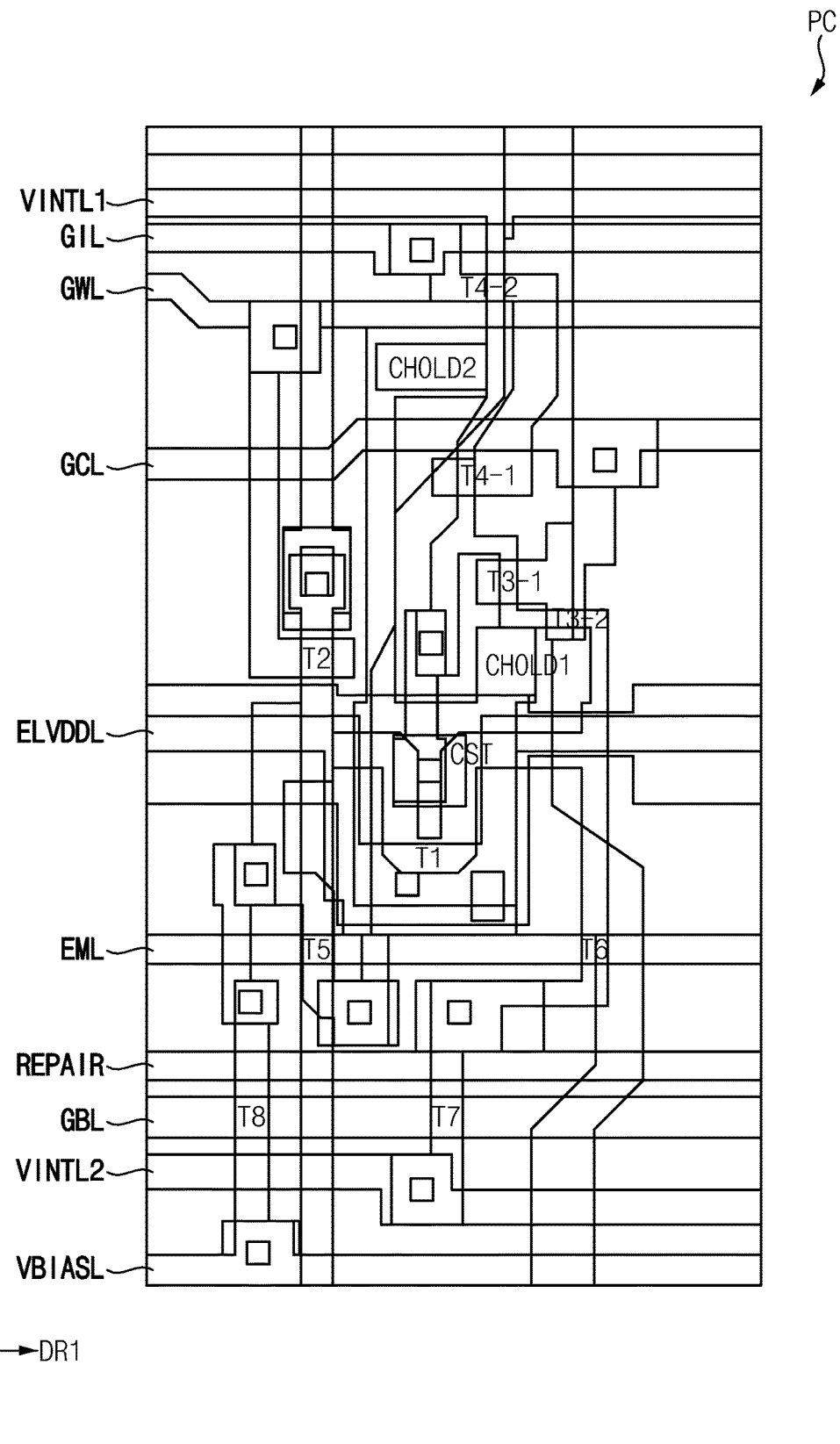
FIG. 2E is a plan view for illustrating a pixel circuit included in the pixel in FIG. 2A.
Figure 2F:
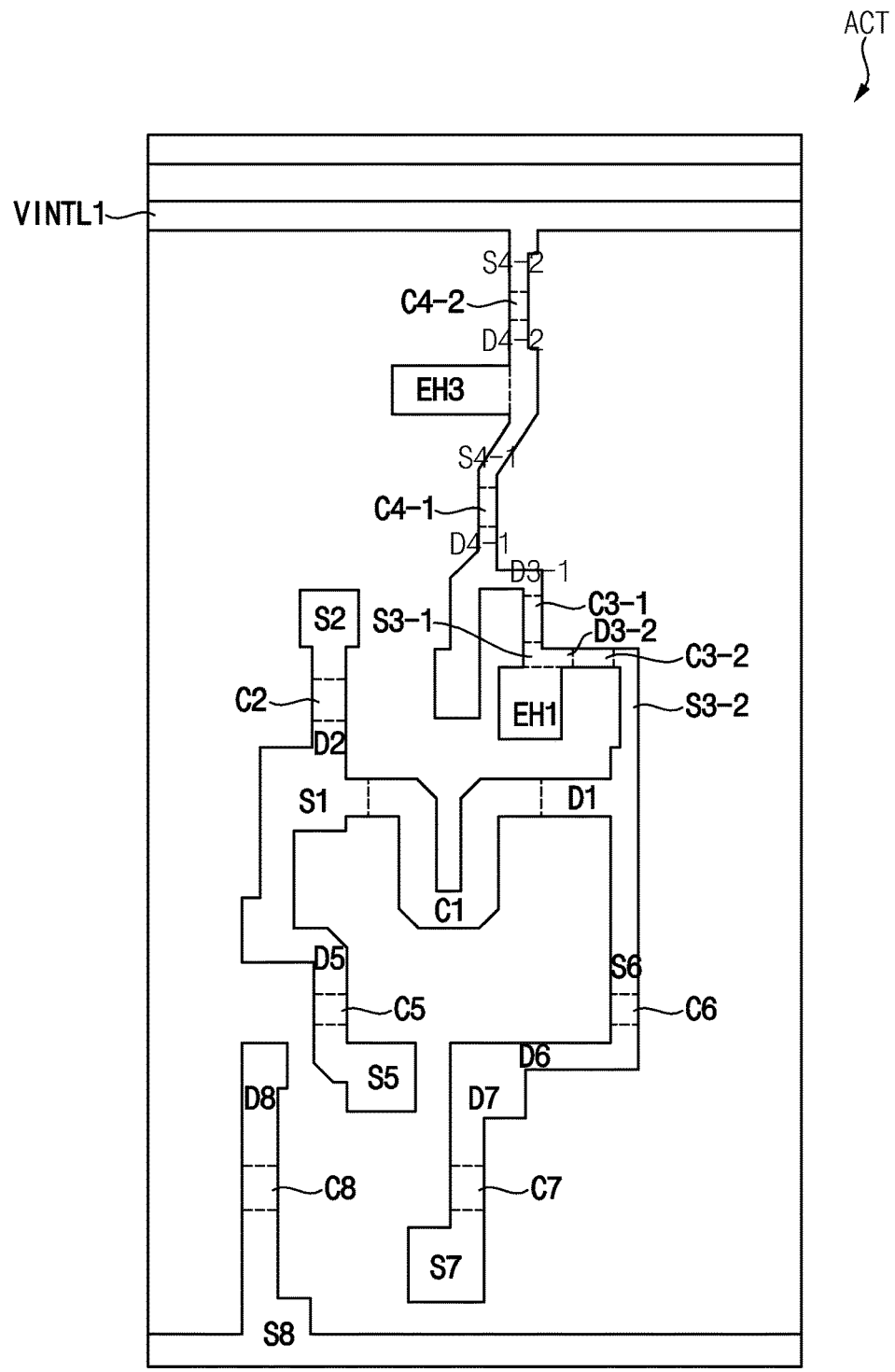
FIG. 2F is a plan view for illustrating an active layer included in the pixel circuit in FIG. 2E.
Figure 2G:
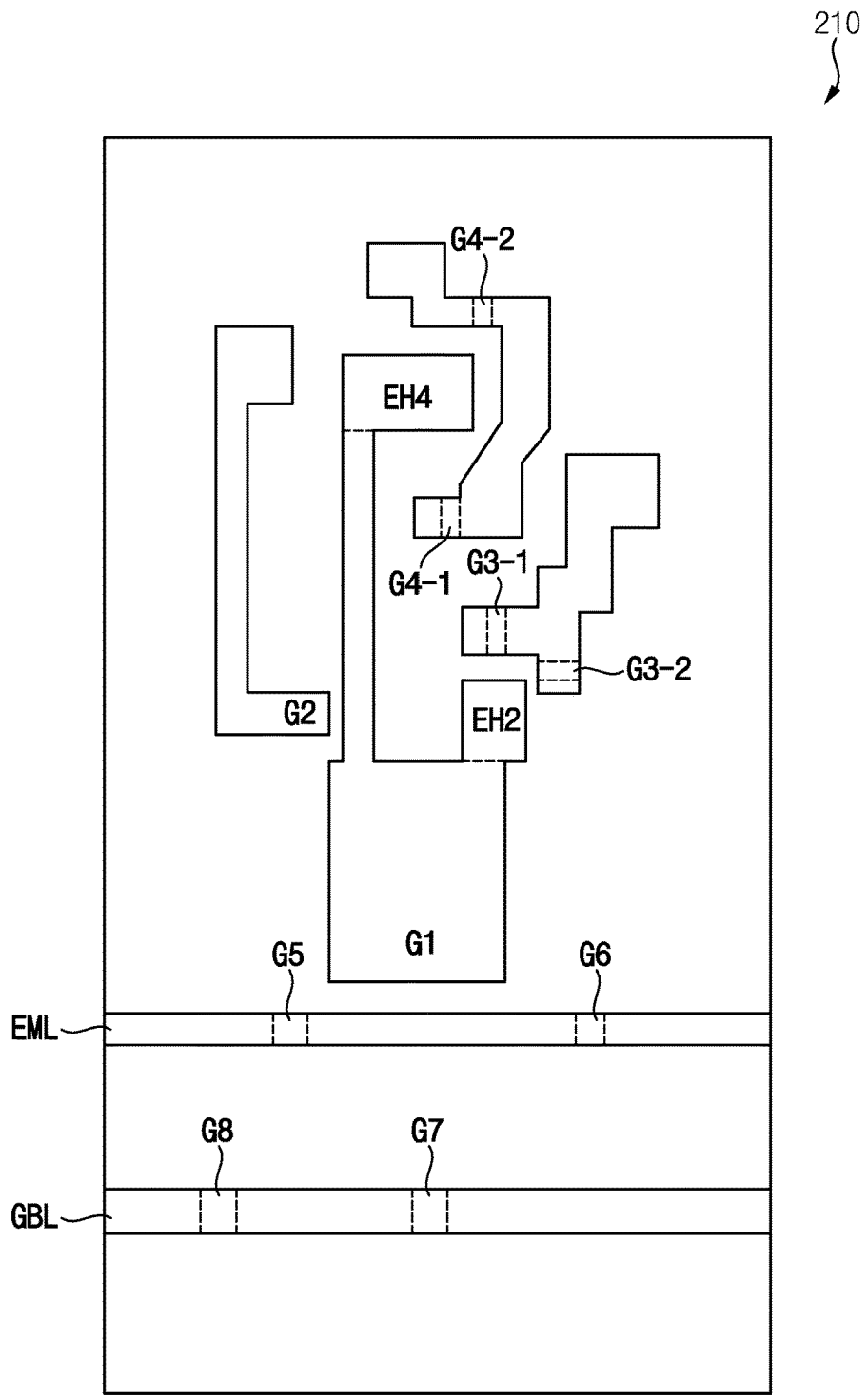
FIG. 2G is a plan view for illustrating a first conductive layer included in the pixel circuit in FIG. 2E.
Figure 2H:
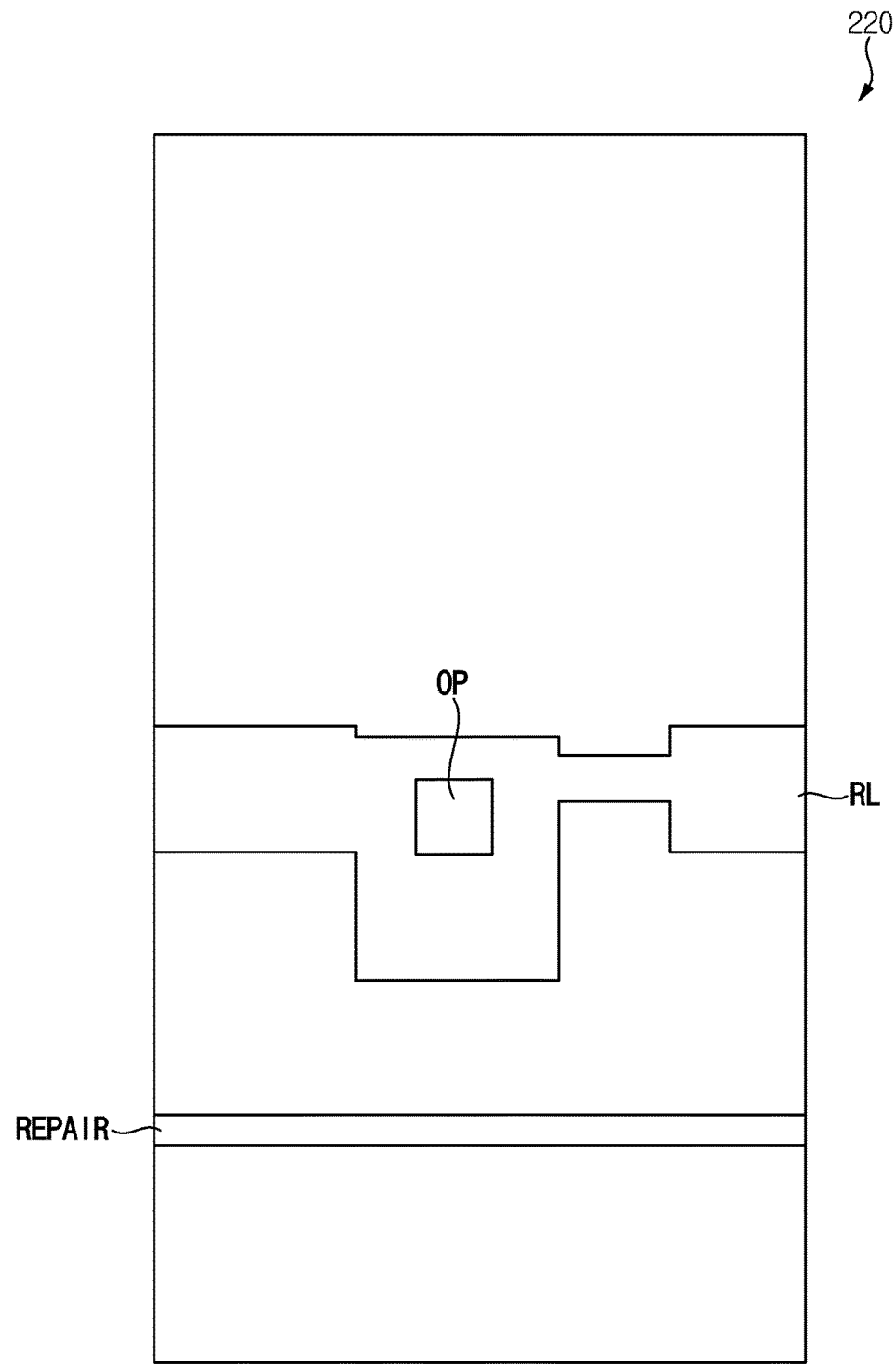
FIG. 2H is a plan view for illustrating a second conductive layer included in the pixel circuit in FIG. 2E.
Figure 21:
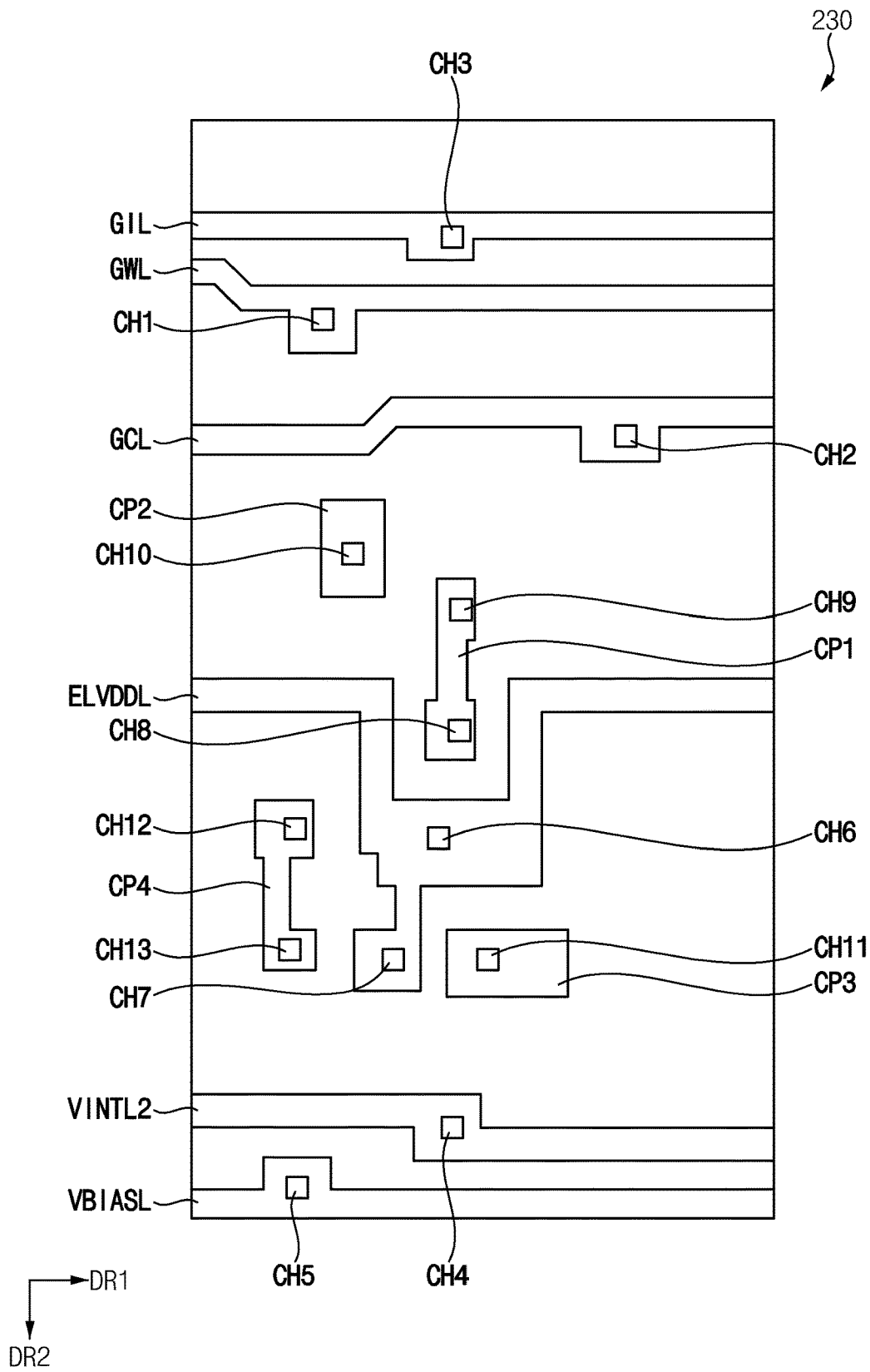
Figure 2J:
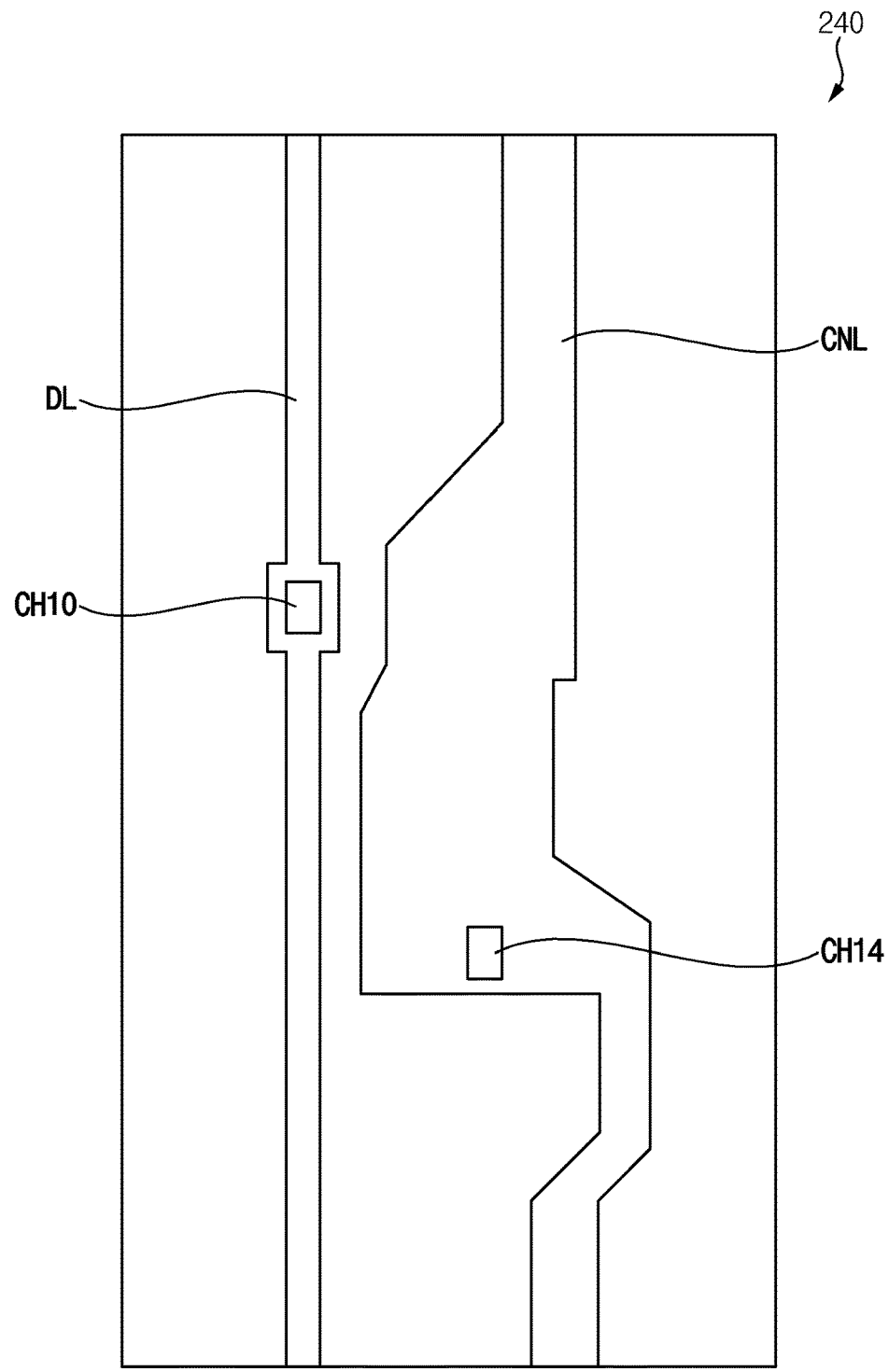
FIG. 2J is a plan view for illustrating a fourth conductive layer included in the pixel circuit in FIG. 2E.

FIG. 2E is a plan view for illustrating a pixel circuit PC included in the pixel Pin FIG. 2A. FIG. 2F is a plan view for illustrating an active layer ACT included in the pixel circuit PC in FIG. 2E. FIG. 2G is a plan view for illustrating a first conductive layer 210 included in the pixel circuit PC in FIG. 2E. FIG. 2H is a plan view for illustrating a second conductive layer 220 included in the pixel circuit PC in FIG. 2E. FIG. 2I is a plan view for illustrating a third conductive layer 230 included in the pixel circuit PC in FIG. 2E. FIG. 2J is a plan view for illustrating a fourth conductive layer 240 included in the pixel circuit PC in FIG. 2E.

Referring to FIGS. 1 to 2J, the pixel circuit PC may include an active layer ACT, a first conductive layer 210, a second conductive layer 220, a third conductive layer 230, and a fourth conductive layer 240. The light emitting element EE may include the anode ANO and the cathode CAT.

Referring to FIGS. 2E and 2F, the active layer ACT may include polycrystalline silicon. The active layer ACT includes a first source region S1, a first drain region D1, a first channel region C1, a second source region S2, a second drain region D2, and a second channel region C2, a first sub-source region S3-1, a first sub-drain region D3-1, a first sub-channel region C3-1, a second sub-source region S3-2, a second sub-drain region D3-2, a second sub-channel region C3-2, a third sub-source region S4-1, a third sub-drain region D4-1, and a third sub-channel region C4-1, a fourth sub-source region S4-2, a fourth sub-drain region D4-2, a fourth sub-channel region C4-2, a fifth source region S5, and a fifth drain region D5, a fifth channel region C5, a sixth source region S6, a sixth drain region D6, a sixth channel region C6, a seventh source region S7, the seventh drain region D7, a seventh channel region C7, an eighth source region S8, an eighth drain region D8, an eighth channel region C8, and a first initialization voltage line VINTL1.

The first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, the third sub-drain region D4-1, the fourth sub-source region S3-2, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 of FIG. 2F may function as the first source electrode S1 and the first drain electrode D1, the second source electrode S2, the second drain electrode D2, the first sub-source electrode S3-1, the first sub-drain electrode D3-1, the second sub-source electrode S3-2, the second sub-drain electrode D3-2, the third sub-source electrode S4-1, the third sub-drain electrode D4-1, the fourth sub-source electrode S4-2, and the fourth sub-drain electrode D4-2, the fifth source electrode S5, the fifth drain electrode D5, the sixth source electrode S6, the sixth drain electrode D6, the seventh source electrode S7, the seventh drain electrode D7, the eighth source electrode S8, and the eighth drain electrode D8 of FIG. 2A, respectively. The first channel region C1 may be disposed between the first source region S1 and the first drain region D1, and the second channel region C2 may be disposed between the second source region S2 and the second drain region D2. The first sub-channel region C3-1 may be disposed between the first sub-source region S3-1 and the first sub-drain region D3-1, and the second sub-channel region C3-2 may be disposed between the second sub source region S3-2 and the second sub drain region D3-2. The third sub-channel region C4-1 may be disposed between the third sub-source region S4-1 and the third sub-drain region D4-1, and the fourth sub-channel region C4-2 may be disposed between the fourth sub-source region S4-2 and the fourth sub-drain region D4-2. The fifth channel region C5 may be disposed between the fifth source region S5 and the fifth drain region D5, and the sixth channel region C6 may be disposed between the sixth source region S6 and the sixth drain region D6. The seventh channel region C7 may be disposed between the seventh source region S7 and the seventh drain region D7, and the eighth channel region C8 may be disposed between the eighth source region S8 and the eighth drain region D8.

The first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, the third sub-drain region D4-1, and the fourth sub-drain region S3-2, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 may be doped with impurities. In an embodiment, the first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, and the third sub-drain region D4-1, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 may be doped with P-type impurities. The first channel region C1, the second channel region C2, the first sub-channel region C3-1, the second sub-channel region C3-2, the third sub-channel region C4-1, the fourth sub-channel region C4-2, the fifth channel region C5, the sixth channel region C6, the seventh channel region C7, and the eighth channel region C8 may not be doped with impurities.

The first initialization voltage line VINTL1 may transfer the first initialization voltage VINT1. The first initialization voltage line VINTL1 may extend in the first direction DR1.

Referring to FIG. 2E to FIG. 2G, the first conductive layer 210 may be disposed on the active layer ACT. The first conductive layer 210 may include a conductive material such as molybdenum (Mo), copper (Cu), aluminum (Al), or titanium (Ti), or the like.

The first conductive layer 210 may include the first gate electrode G1, the second gate electrode G2, the third gate electrode G3, the fourth gate electrode G4, the fourth gate line GBL, and the emission line EML. The first gate electrode G1 may overlap the first channel region C1 in a plan view. The first source region S1, the first drain region D1, the first channel region C1, and the first gate electrode G1 may form the first transistor T1. The second gate electrode G2 may overlap the second channel region C2 in the plan view. The second source region S2, the second drain region D2, the second channel region C2, and the second gate electrode G2 may form the second transistor T2.

The third gate electrode G3 may include the first sub-gate electrode G3-1 and the second sub-gate electrode G3-2. The first sub-gate electrode G3-1 may overlap the first sub-channel region C3-1 in the plan view. The first sub-source region S3-1, the first sub-drain region D3-1, the first sub-channel region C3-1, and the first sub-gate electrode G3-1 may form the first sub-transistor T3-1. The second sub-gate electrode G3-2 may overlap the second sub-channel region C3-2 in the plan view. The second sub-source region S3-2, the second sub-drain region D3-2, the second sub-channel region C3-2, and the second sub-gate electrode G3-2 may form the second sub-transistor T3-2. The first hold region EH1 and the second hold region EH2 may form the first hold capacitor CHOLD1.

The fourth gate electrode G4 may include the third sub-gate electrode G4-1 and the fourth sub-gate electrode G4-2. The third sub-gate electrode G4-1 may overlap the third sub-channel region C4-1 in the plan view. The third sub-source region S4-1, the third sub-drain region D4-1, the third sub-channel region C4-1, and the third sub-gate electrode G4-1 may form the third sub-transistor T4-1. The fourth sub-gate electrode G4-2 may overlap the fourth sub-channel region C4-2 in the plan view. The fourth sub-source region S4-2, the fourth sub-drain region D4-2, the fourth sub-channel region C4-2, and the fourth sub-gate electrode G4-2 may form the fourth sub-transistor T4-2. The third hold region EH3 and the fourth hold region EH4 may form the second hold capacitor CHOLD2.

The emission line EML may transfer the emission signal EM. The emission line EML may extend in the first direction DR1. The emission line EML may include the fifth gate electrode G5 and the sixth gate electrode G6. The fifth gate electrode G5 may overlap the fifth channel region C5 in the plan view. The fifth source region S5, the fifth drain region D5, the fifth channel region C5, and the fifth gate electrode G5 may form the fifth transistor T5. The sixth gate electrode G6 may overlap the sixth channel region C6 in the plan view. The sixth source region S6, the sixth drain region D6, the sixth channel region C6, and the sixth gate electrode G6 may form the sixth transistor T6.

The fourth gate line GBL may transfer the fourth gate signal GB. The fourth gate line GBL may extend in the first direction DR1. The fourth gate line GBL may include the seventh gate electrode G7 and the eighth gate electrode G8. The seventh gate electrode G7 may overlap the seventh channel region C7 in the plan view. The seventh source region S7, the seventh drain region D7, the seventh channel region C7, and the seventh gate electrode G7 may form the seventh transistor T7. The eighth gate electrode G8 may overlap the eighth channel region C8 in the plan view. The eighth source region S8, the eighth drain region D8, the eighth channel region C8, and the eighth gate electrode G8 may form the eighth transistor T8.

Referring to FIGS. 2E to 2H, the second conductive layer 220 may be disposed on the first conductive layer 210. The second conductive layer 220 may include the conductive material such as molybdenum (Mo), copper (Cu), aluminum (Al), or titanium (Ti) or the like.

The second conductive layer 220 may include a storage line RL and a repair line REPAIR. The storage line RL may extend in the first direction DR1. The storage line RL may overlap the first gate electrode G1, the first sub-drain region D3-1, the second sub-source region S3-2, the third sub-drain region D4-1, the fourth sub-drain region D4-1, and the fourth sub-source region S4-2 in the plan view. The first gate electrode G1 and the storage line RL may form the storage capacitor CST.

An opening OP may be defined in the storage line RL. The opening OP may overlap the first gate electrode G1 in the plan view.

Referring to FIGS. 2E to 2I, The third conductive layer 230 may be disposed on the second conductive layer 220. The third conductive layer 230 may include the conductive material such as molybdenum (Mo), copper (Cu), aluminum (Al), or titanium (Ti) or the like.

The third conductive layer 230 may include the first power supply voltage line ELVDDL, the first gate line GWL, the second gate line GCL, the third gate line GIL, a first connection pattern CP1, a second connection pattern CP2, a third connection pattern CP3, a fourth connection pattern CP4, the second initialization voltage line VINTL2, and the bias voltage line VBIASL.

The first power supply voltage line ELVDDL may transfer the first power supply voltage ELVDD. The first power supply voltage line ELVDDL may extend in the first direction DR1 in part and in the second direction DR2 in part. The first power supply voltage line ELVDDL may contact the storage line RL through a sixth contact hole CH6 and the fifth source electrode S5 through a seventh contact hole CH7.

The first gate line GWL may transfer the first gate signal GW. The first gate line GWL may contact the second gate electrode G2 through a first contact hole CH1. The first gate line GWL may extend in the first direction DR1.

The second gate line GCL may transfer the second gate signal GC. The second gate line GCL may contact the third gate electrode G3 through a second contact hole CH2. The second gate line GCL may extend in the first direction DR1.

The third gate line GIL may transfer the third gate signal GI. The third gate line GIL may contact the fourth gate electrode G4 through a third contact hole CH3. The third gate line GIL may extend in the first direction DR1.

The first connection pattern CP1 may connect the first sub-drain region D3-1, the third sub-drain region D4-1, and the first gate electrode G1. The first connection pattern CP1 may contact the first sub-drain region D3-1 and the third sub-drain region D4-1 through a ninth contact hole CH9, and may contact the first gate electrode G1 through a eighth contact hole CH8. The eighth contact hole CH8 may be positioned in the opening OP in the plan view.

The second connection pattern CP2 may be connected to the second source region S2. The second connection pattern CP2 may contact the second source region S2 through a tenth contact hole CH10.

The third connection pattern CP3 may be connected to the sixth drain region D6 and the seventh drain region D7. The third connection pattern CP3 may contact the sixth drain region D6 and the seventh drain region D7 through the eleventh contact hole CH11.

The fourth connection pattern CP4 may connect the first source region S1 and the eighth drain region D8. The fourth connection pattern CP4 may contact the first source region S1 through a twelfth contact hole CH12 and may contact the eighth drain region D1 through a thirteenth contact hole CH13.

The second initialization voltage line VINTL2 may transfer the second initialization voltage VINT2. The second initialization voltage line VINTL2 may contact the seventh source region S7 through a fourth contact hole CH4. The second initialization voltage line VINTL2 may extend in the first direction DR1.

The bias voltage line VBIASL may transfer the bias voltage VBIAS. The bias voltage line VBIASL may contact the eighth source region S8 through the fifth contact hole CH5. The bias voltage line VBIASL may extend in the first direction DR1.

The fourth conductive layer 240 may be disposed on the third conductive layer 230. The fourth conductive layer 240 may include the conductive material such as molybdenum (Mo), copper (Cu), aluminum (Al), or titanium (Ti) or the like.

Referring to FIGS. 2E to 2J, The fourth conductive layer 240 may include a data line DL and a connection line CNL.

The data line DL may transfer the data voltage VDATA. The data line DL may contact the second connection pattern CP2 through the tenth contact hole CH10. The data line DL may extend in the second direction DR2. In an embodiment, the second direction DR2 may cross the first direction DR1.

The connection line CNL may be connected to the first power supply voltage line ELVDDL through a fourteenth contact hole CH14. The connection line CNL may extend in the second direction DR2.

Figure 3A:
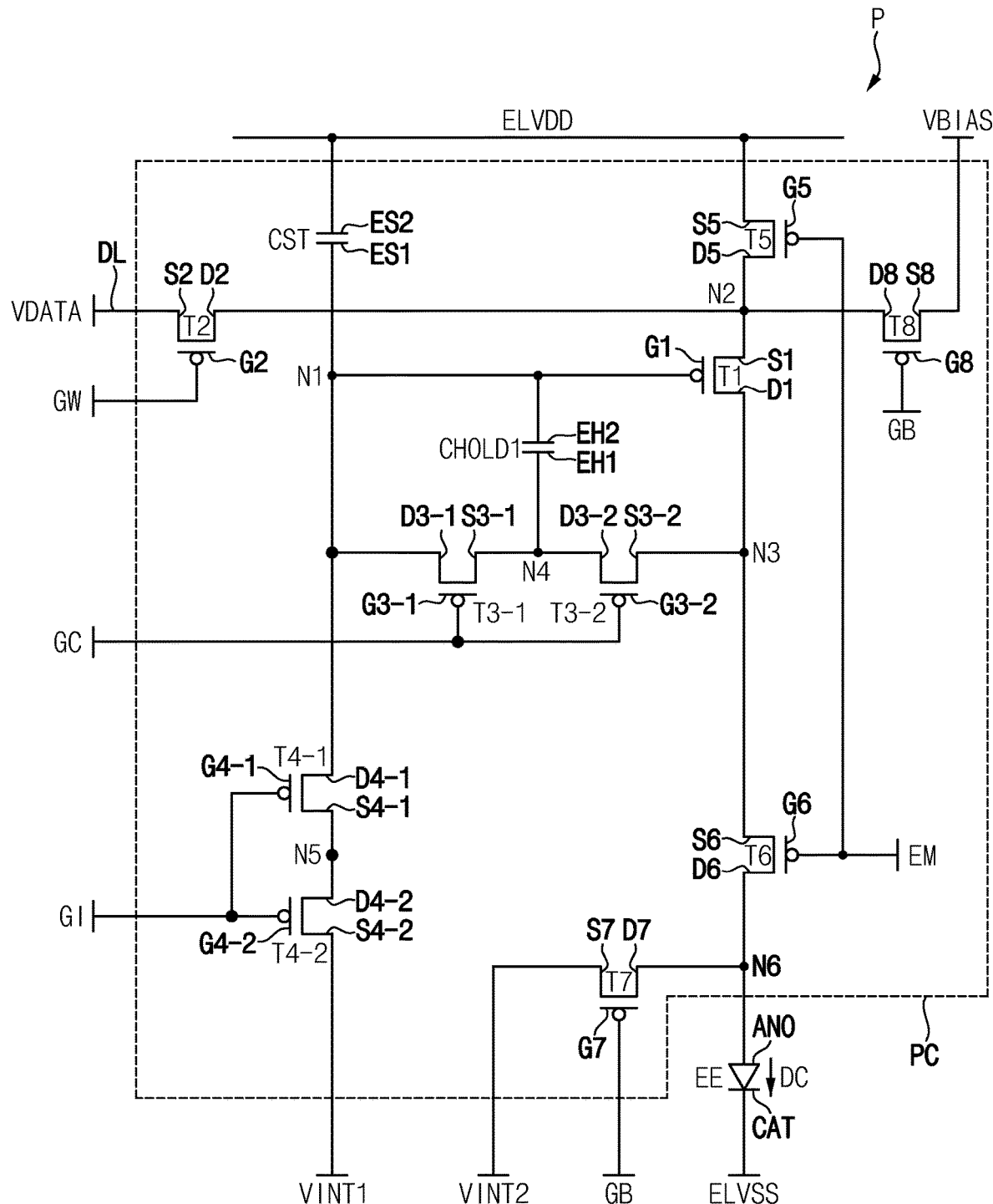
FIG. 3A is a circuit diagram for illustrating an example of a pixel included in the display device in FIG. 1.
Figure 3B:
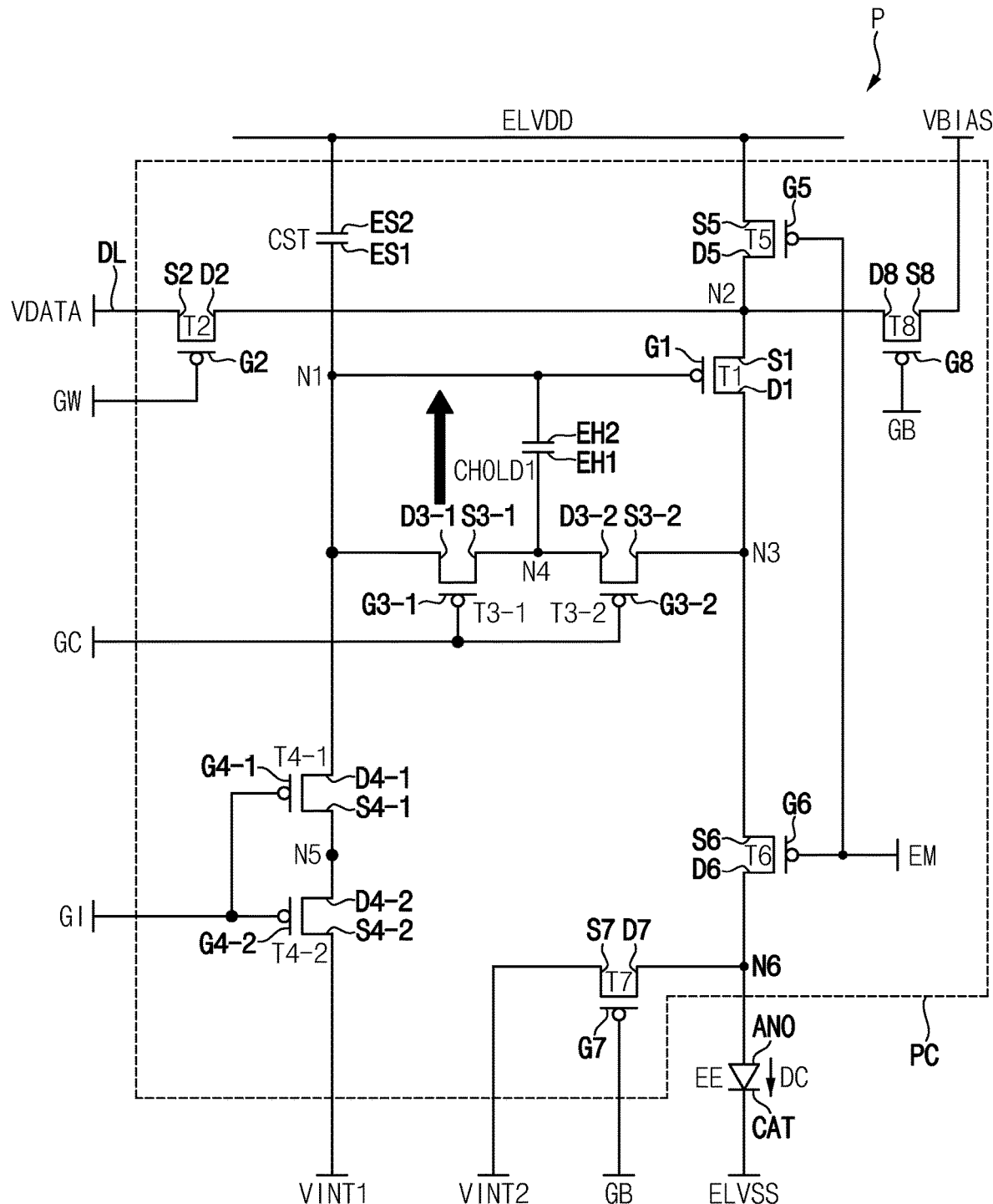
FIGS. 3B and 3C are circuit diagrams for illustrating an operation of the pixel in FIG. 3A.
Figure 3C:
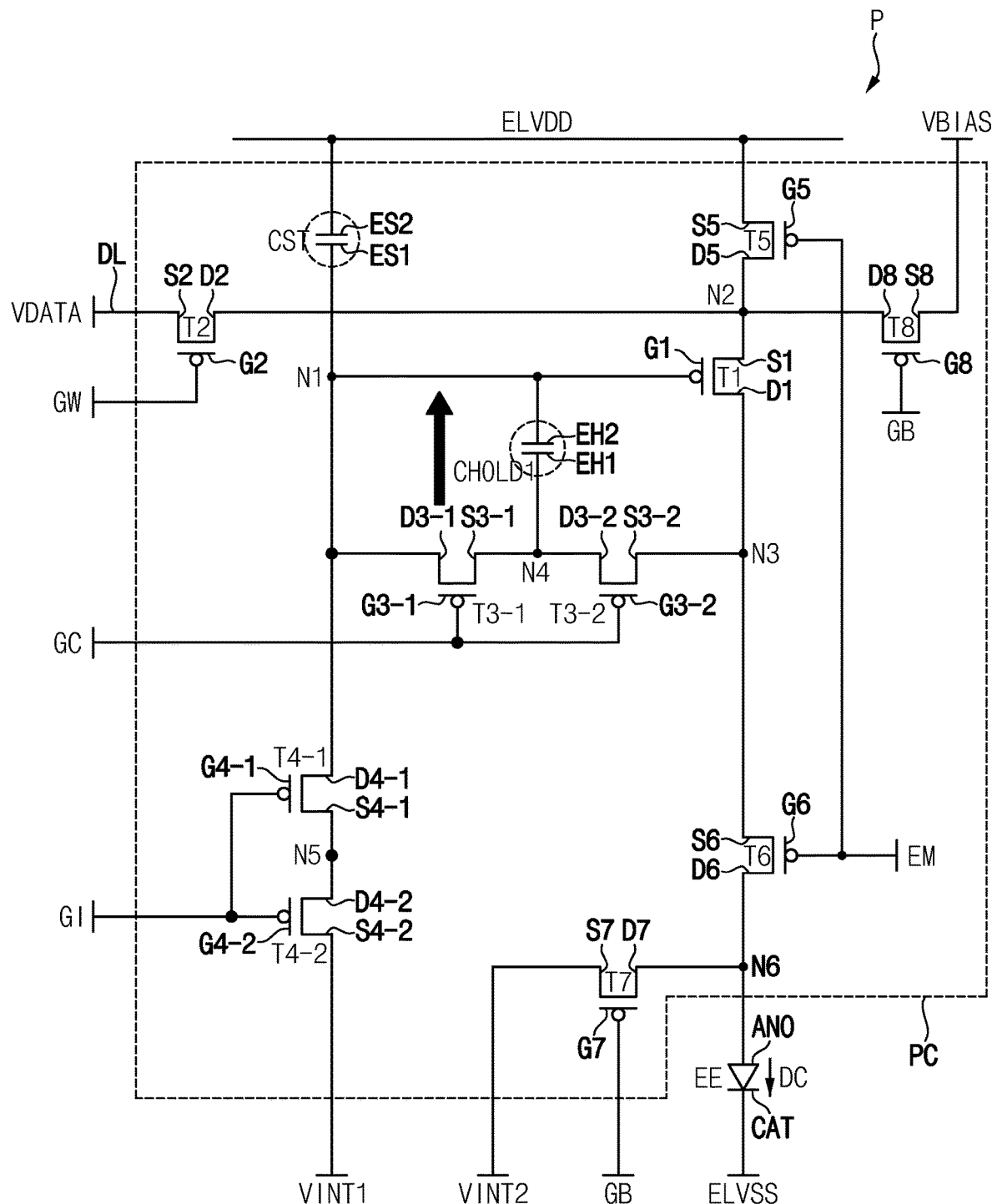

FIG. 3A is a circuit diagram for illustrating an example of a pixel P included in the display device 10 in FIG. 1. FIGS. 3B and 3C are circuit diagrams for illustrating an operation of the pixel P in FIG. 3A.

Since a circuit diagram of FIG. 3A may have substantially the same configuration as the circuit diagram of FIG. 2A except for the second hold capacitor CHOLD2, overlapping descriptions with the circuit diagram of FIG. 2A will be omitted in describing the circuit diagram of FIG. 3A.

Referring to FIGS. 1 to 3C, a pixel circuit PC may include a plurality of transistors and at least one capacitor. In an embodiment, the pixel circuit PC may include a first transistor T1, a second transistor T2, a third transistor T3, a fourth transistor T4, a fifth transistor T5, and a sixth transistor T6, a seventh transistor T7, an eighth transistor T8, a first hold capacitor CHOLD1, and a storage capacitor CST.

When the display panel 100 operates in the low-frequency driving mode, a leakage current may be generated in the third transistor T3 so that luminance of the display panel 100 may undesirably decrease. As such, when the data voltage VDATA is applied to the pixel P after the luminance of the display panel 100 undesirably decreases, the luminance of the display panel 100 becomes bright and may be recognized as the flicker.

In order to solve this problem, in an embodiment, the pixel circuit PC may include the first hold capacitor CHOLD1 disposed between a gate electrode G1 (i.e., a first node N1) and an intermediate node (i.e., a fourth node N4) of a first sub-transistor T3-1 and a second sub-transistor T3-2.

A voltage of the first gate electrode G1 may be boosted by the first hold capacitor CHOLD1. A boosting voltage of the first gate electrode G1 may be determined by a series connection of the storage capacitor CST and the first hold capacitor CHOLD1. The boosting voltage of the first gate electrode G1 may be determined by an [Equation 2] below:

$$\Delta VN1 = \frac{C\_CHOLD1}{C\_CST + C\_CHOLD1} \times \Delta VN4 \quad \text{[Equation 2]}$$

Here, $\Delta VN1$ denotes the boosting voltage of the first gate electrode G1, C_CHOLD1 denotes a capacitance of the first hold capacitor CHOLD1, C_CST denotes a capacitance of the storage capacitor CST, and $\Delta VN4$ denotes a variation voltage of the intermediate node of the first sub-transistor T3-1 and the second sub-transistor T3-2.

Figure 3D:
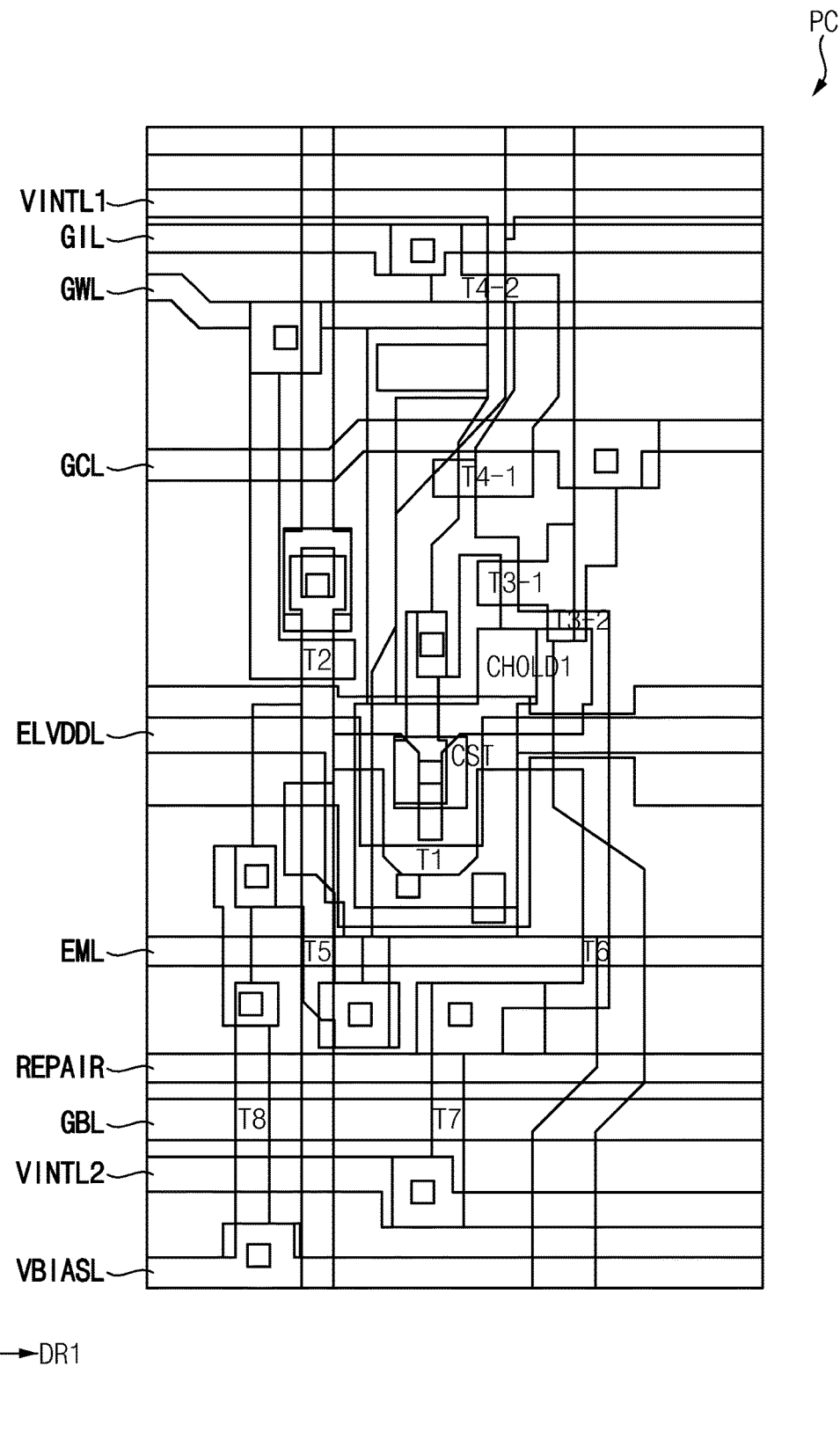
FIG. 3D is a plan view for illustrating a pixel circuit included in the pixel in FIG. 3A.

FIG. 3D is a plan view for illustrating a pixel circuit PC included in the pixel P in FIG. 3A.

Since a plan view of FIG. 3D may have substantially the same configuration as the plan view of FIG. 2E except for the first conductive layer, overlapping descriptions with the plan view of FIG. 2E will be omitted in describing the plan view of FIG. 3D. Referring to FIGS. 1 to 3D, a first hold region EH1 and a second hold region EH2 may form the first hold capacitor CHOLD1.

Figure 4A:
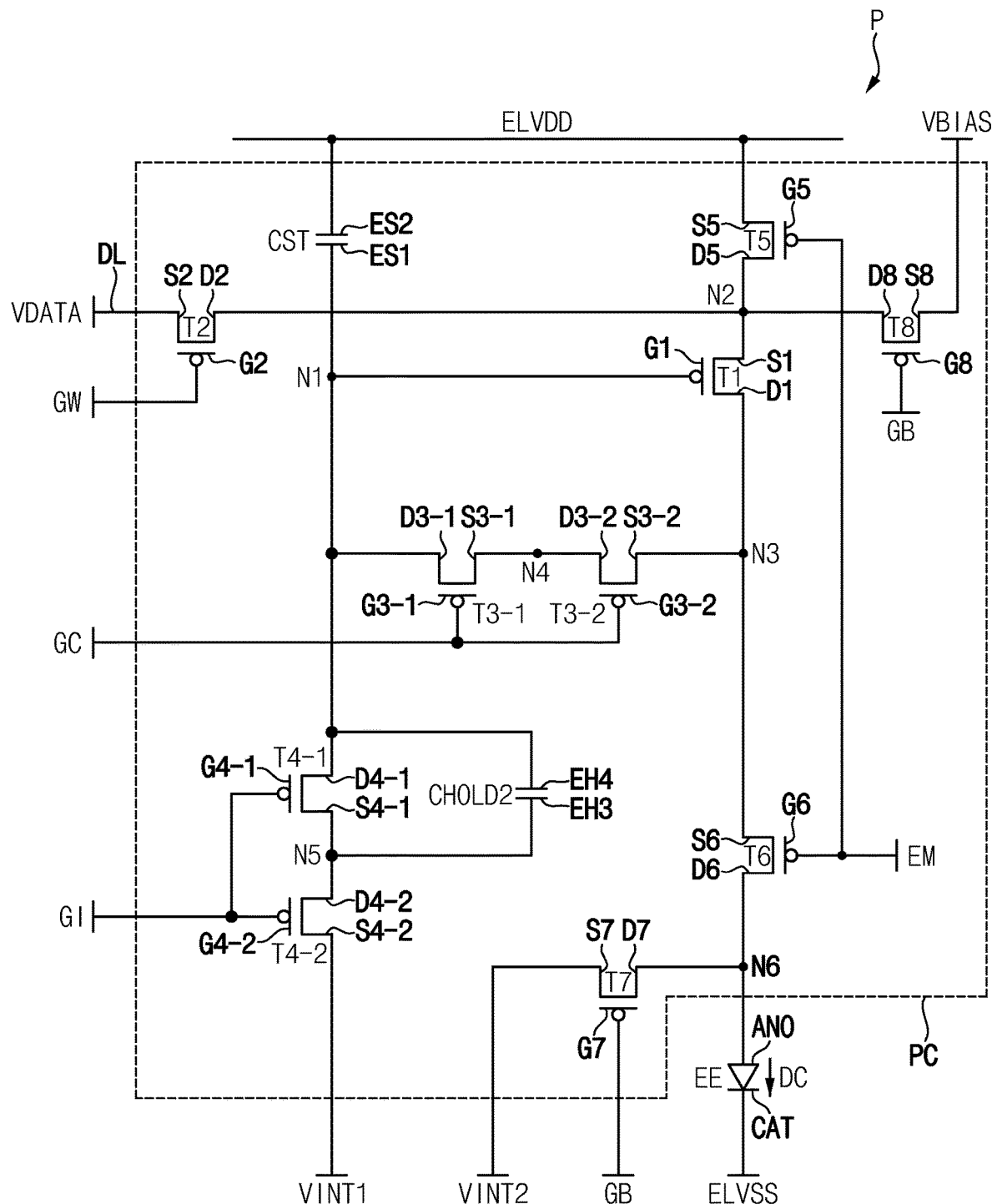
FIG. 4A is a circuit diagram for illustrating an example of a pixel included in the display device in FIG. 1.
Figure 4B:
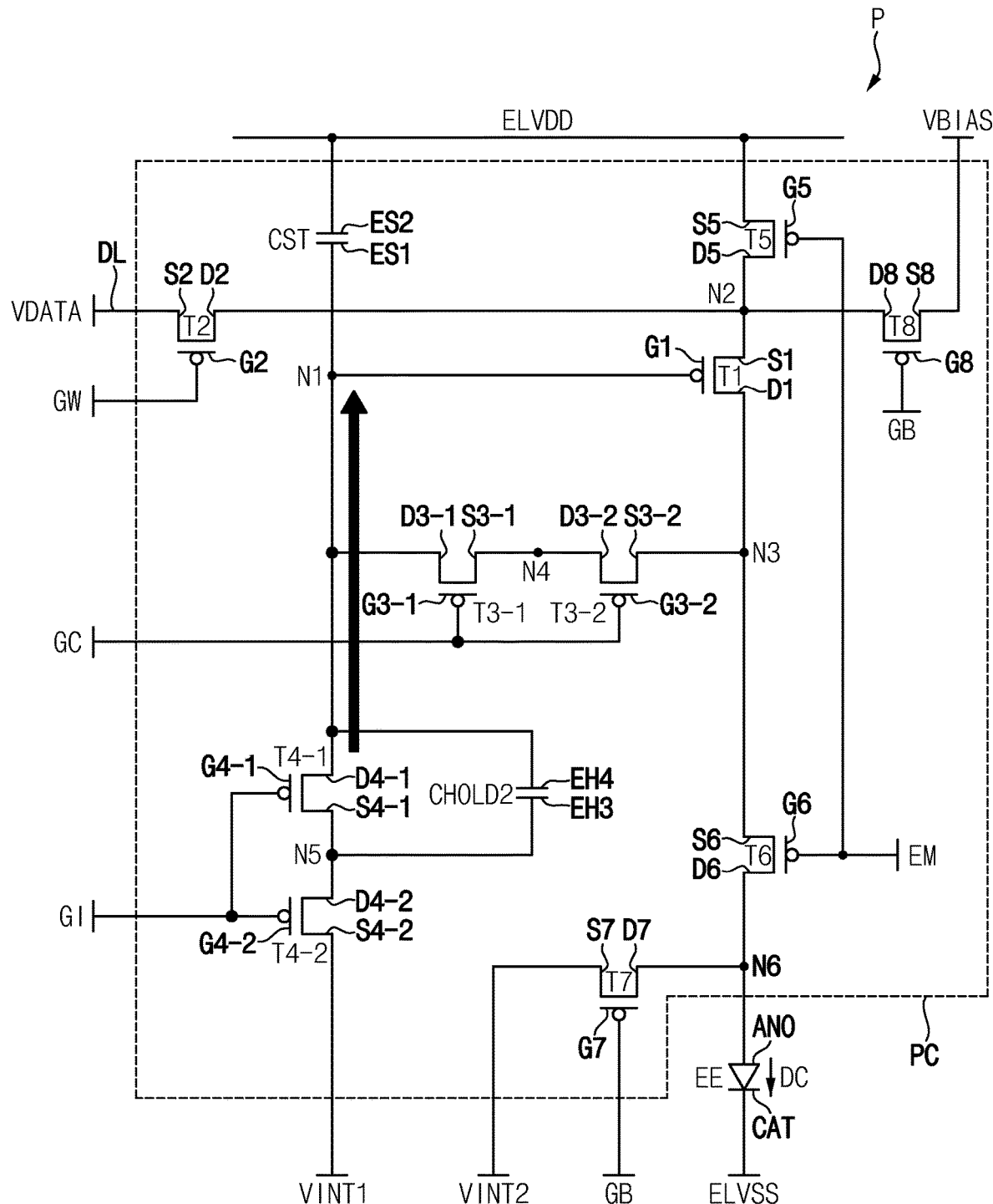
FIGS. 4B and 4C are circuit diagrams for illustrating an operation of the pixel in FIG. 4A.
Figure 4C:
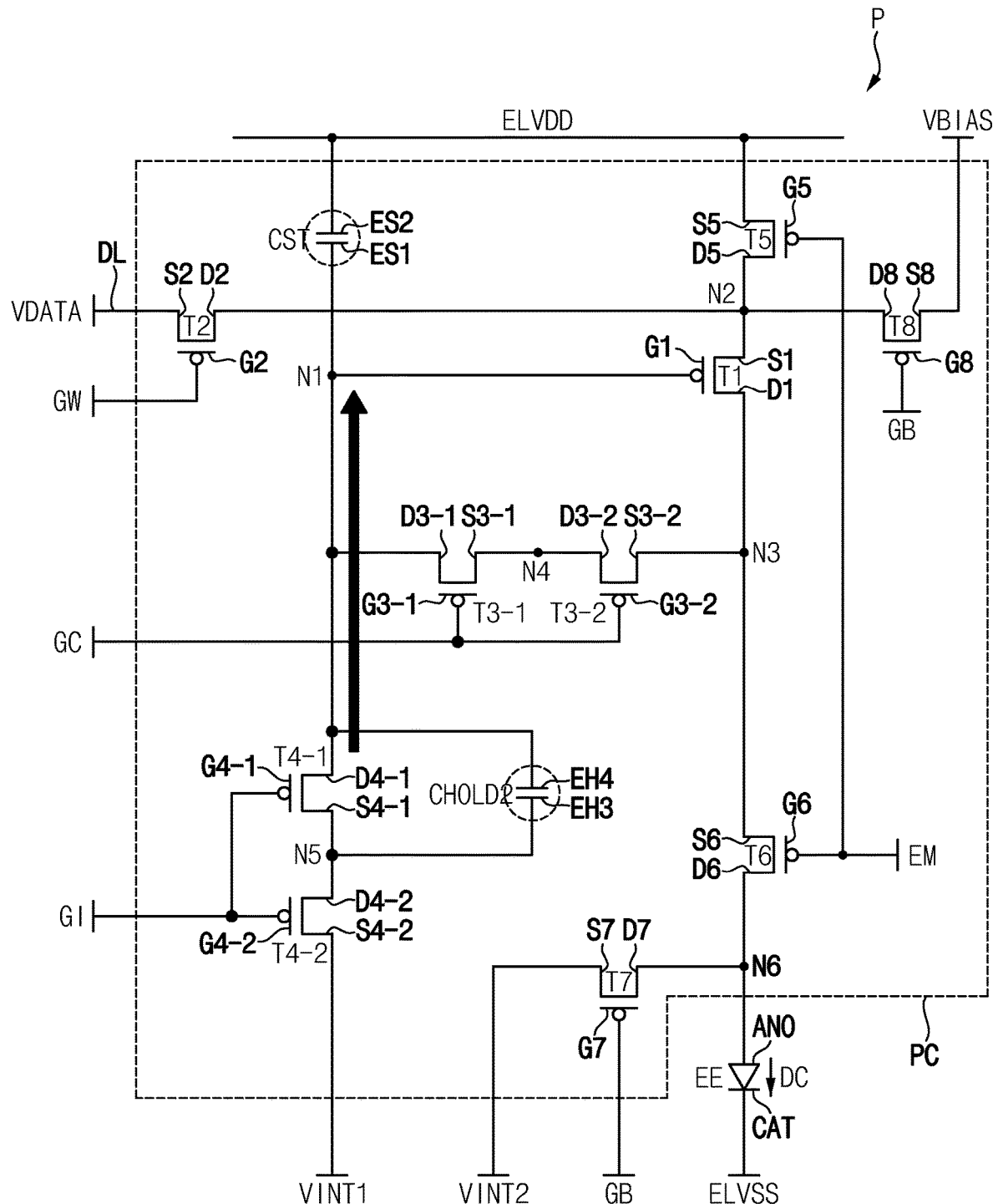

FIG. 4A is a circuit diagram for illustrating an example of a pixel P included in the display device 10 in FIG. 1. FIGS. 4B and 4C are circuit diagrams for illustrating an operation of the pixel P in FIG. 4A.

Since a circuit diagram of FIG. 4A may have substantially the same configuration as the circuit diagram of FIG. 2A except for the first hold capacitor CHOLD1, overlapping descriptions with the circuit diagram of FIG. 2A will be omitted in describing the circuit diagram of FIG. 4A.

Referring to FIGS. 1 to 4B, a pixel circuit PC may include a plurality of transistors and at least one capacitor. In an embodiment, the pixel circuit PC may include a first transistor T1, a second transistor T2, a third transistor T3, a fourth transistor T4, a fifth transistor T5, and a sixth transistor T6, a seventh transistor T7, an eighth transistor T8, a second hold capacitor CHOLD2, and a storage capacitor CST.

When the display panel 100 operates in the low-frequency driving mode, a leakage current may be generated in the fourth transistor T4 so that luminance of the display panel 100 may undesirably decrease. As such, when the data voltage VDATA is applied to the pixel P after the luminance of the display panel 100 undesirably decreases, the luminance of the display panel 100 becomes bright and may be recognized as the flicker.

In order to solve this problem, in an embodiment, the pixel circuit PC may include the second hold capacitor CHOLD2 disposed between a gate electrode G1 (i.e., a first node N1) and an intermediate node (i.e., a fifth node N5) of a third sub-transistor T4-1 and a fourth sub-transistor T4-2.

A voltage of the first gate electrode G1 may be boosted by the second hold capacitor CHOLD2. A boosting voltage of the first gate electrode G1 may be determined by a series connection of the storage capacitor CST and the second hold capacitor CHOLD2. The boosting voltage of the first gate electrode G1 may be determined by an [Equation 3] below:

$$\Delta VN1 = \frac{C\_CHOLD2}{C\_CST + C\_CHOLD2} \times \Delta VN5 \quad \text{[Equation 3]}$$

Here, $\Delta VN1$ denotes the boosting voltage of the first gate electrode G1, C_CHOLD2 denotes a capacitance of the second hold capacitor CHOLD2, C_CST denotes a capacitance of the storage capacitor CST, and $\Delta VN5$ denotes a variation voltage of the intermediate node of the third sub-transistor T4-1 and the fourth sub-transistor T4-2.

Figure 4D:
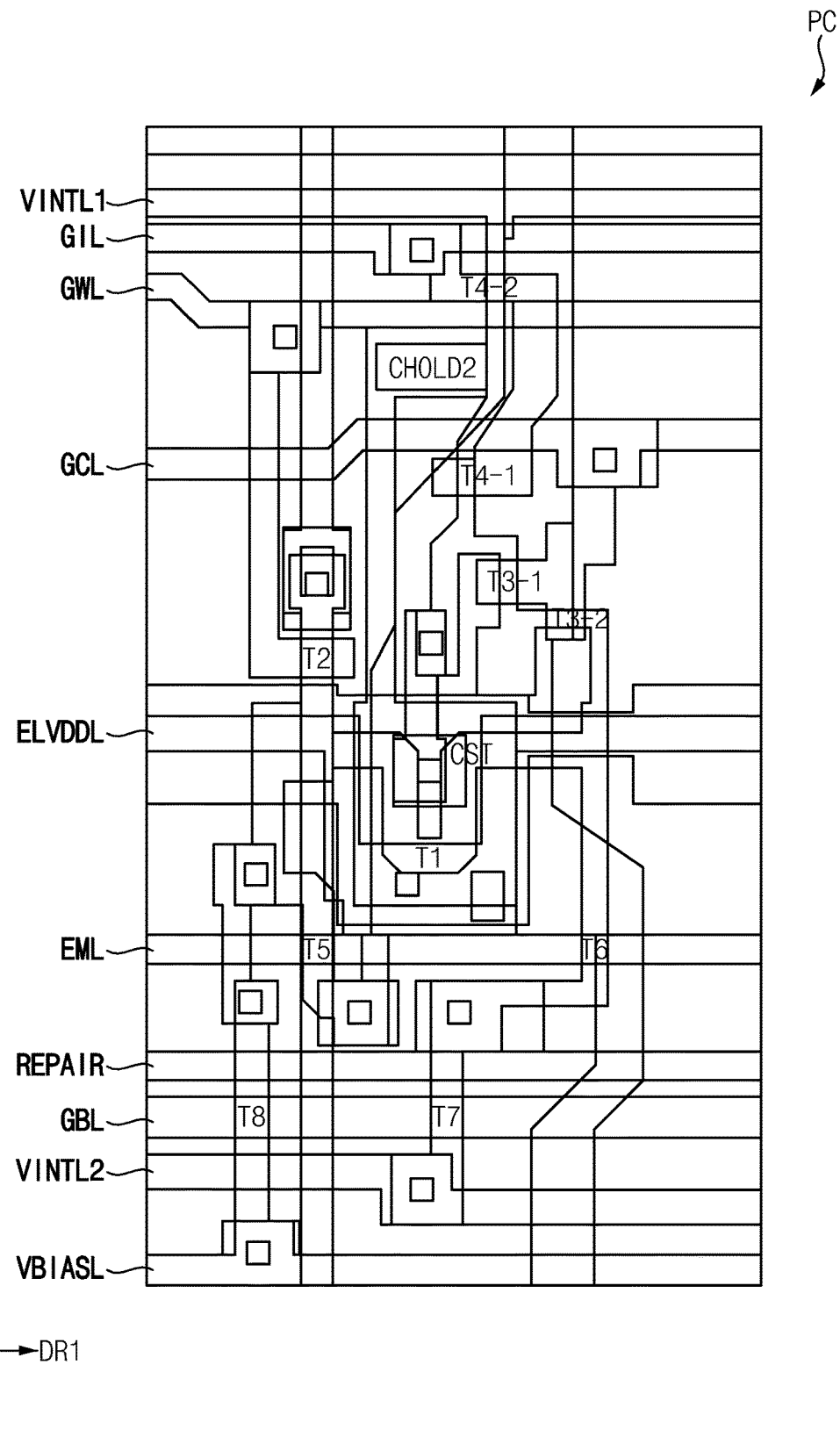
FIG. 4D is a plan view for illustrating a pixel circuit included in the pixel in FIG. 4A.

FIG. 4D is a plan view for illustrating a pixel circuit PC included in the pixel P in FIG. 4A.

Since a plan view of FIG. 4D may have substantially the same configuration as the plan view of FIG. 2E except for the first conductive layer, overlapping descriptions with the plan view of FIG. 2E will be omitted in describing the plan view of FIG. 4D. Referring to FIGS. 1 to 4D, a third hold region EH3 and a fourth hold region EH4 may form the first hold capacitor CHOLD2.

Figure 5:
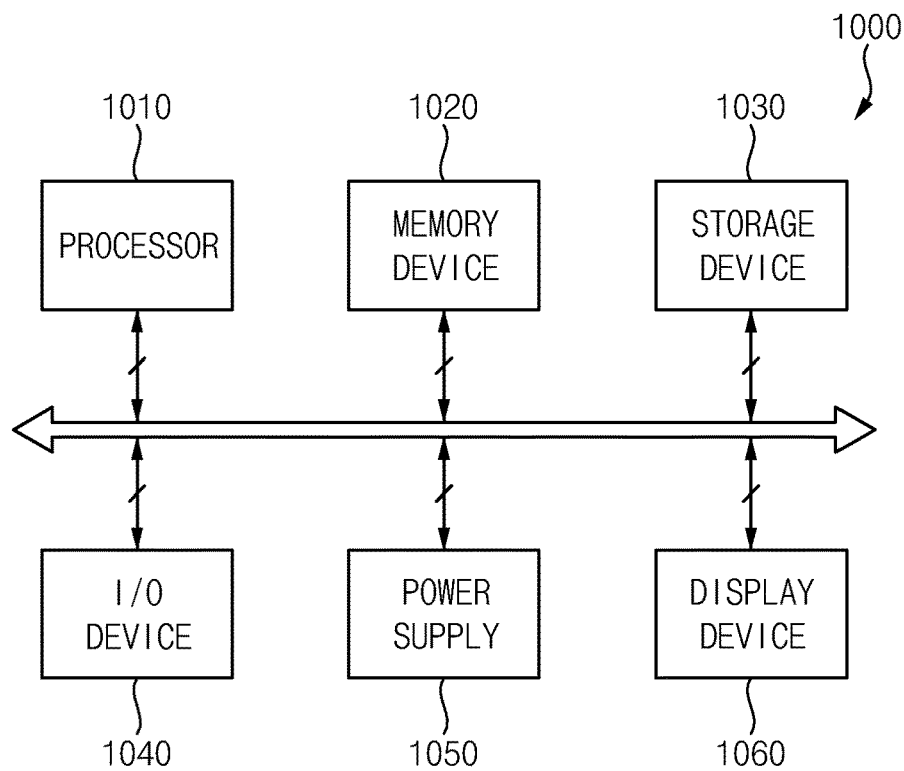
FIG. 5 is a block diagram for illustrating an electronic device according to embodiments of the present inventive concept.
Figure 6:
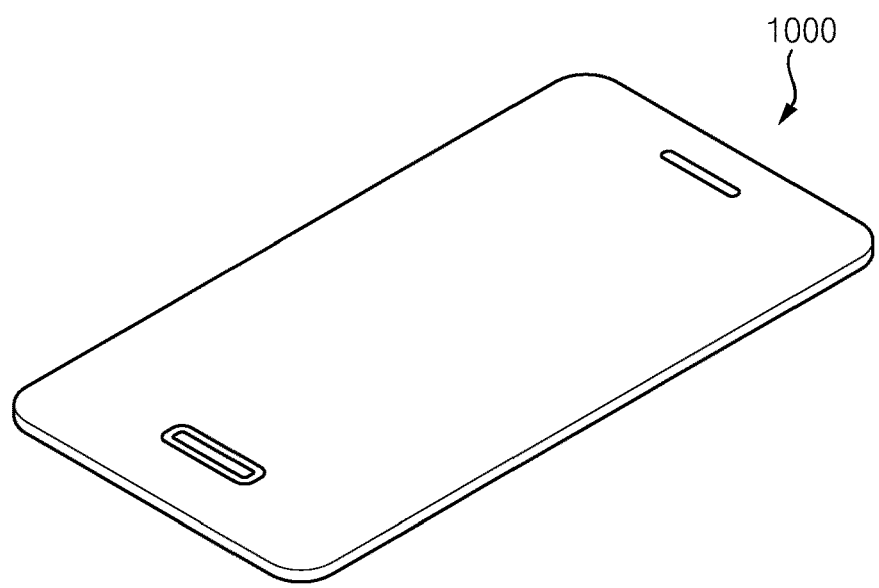
FIG. 6 is a diagram illustrating an embodiment in which the electronic device of FIG. 5 is implemented as a smart phone.

FIG. 5 is a block diagram illustrating an electronic device 1000. FIG. 6 is a diagram illustrating an embodiment in which the electronic device 1000 of FIG. 5 is implemented as a smart phone.

Referring to FIGS. 5 and 6, the electronic device 1000 may include a processor 1010, a memory device 1020, a storage device 1030, an input/output (I/O) device 1040, a power supply 1050, and a display device 1060. The display device 1060 may be the display device 10 of FIG. 1. In addition, the electronic device 1000 may further include a plurality of ports for communicating with a video card, a sound card, a memory card, a universal serial bus (USB) device, other electronic device, and the like.

In an embodiment, as illustrated in FIG. 6, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions. The processor 1010 may be a micro processor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus.

The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like.

The I/O device 1040 may include an input device such as a keyboard, a keypad, a mouse device, a touch-pad, a touch-screen, and the like, and an output device such as a printer, a speaker, and the like. In some embodiments, the I/O device 1040 may include the display device 1060.

The power supply 1050 may provide power for operations of the electronic device 1000.

The display device 1060 may be connected to other components through buses or other communication links.

The inventive concepts may be applied to any display device and any electronic device including the touch panel. For example, the inventive concepts may be applied to a mobile phone, a smart phone, a tablet computer, a digital television (TV), a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of the inventive concept and is not to be construed as limiting thereof. Although embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A pixel circuit, comprising:
a light emitting element including an anode and a cathode;
a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region;
a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region;
a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region;
a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region;
a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region;
a storage capacitor including a first storage electrode electrically connected to the first gate electrode and a second storage electrode electrically connected to the first power supply voltage line;

a first hold capacitor including a first hold electrode electrically connected to the first sub-source region and a second hold electrode electrically connected to the first gate electrode; and a second hold capacitor including a third hold electrode electrically connected to the third sub-source region and a fourth hold electrode electrically connected the first gate electrode, wherein an active layer includes:
- the first source region, the first drain region, and the first channel region;
- the first sub-source region, the first sub-drain region, and the first sub-channel region;
- the second sub-source region, the second sub-drain region, and the second sub-channel region;
- the third sub-source region, the third sub-drain region, and the third sub-channel region;
- the fourth sub-source region, the fourth sub-drain region, and the fourth sub-channel region;
- the first hold electrode; and
- the third hold electrode, and wherein a conductive layer is disposed on the active layer and includes the first gate electrode, the first sub-gate electrode, the second sub-gate electrode, the third sub-gate electrode, the fourth sub-gate electrode, the second hold electrode, and the fourth hold electrode.

2. The pixel circuit of claim 1, wherein a frame period in which the pixel circuit is driven includes a threshold voltage compensating period for compensating a threshold voltage of the first transistor, and wherein, during the threshold voltage compensating period, the first sub-transistor and the second sub-transistor are turned on in response to a second gate signal.

3. The pixel circuit of claim 1, wherein a frame period in which the pixel circuit is driven includes an initialization period in which the first gate electrode is initialized, and wherein, during the initialization period, the third sub-transistor and the fourth sub-transistor are turned on in response to a third gate signal.

4. The pixel circuit of claim 1, wherein a voltage of the first gate electrode is boosted by the first hold capacitor and the second hold capacitor.

5. The pixel circuit of claim 1, wherein a boosting voltage of the first gate electrode is determined by a series connection of the storage capacitor and the first hold capacitor and a series connection of the storage capacitor and the second hold capacitor.

6. The pixel circuit of claim 1, wherein, when a second gate signal applied to the first and second sub-gate electrodes increases, a voltage of the first sub-source region increases, and wherein, when the second gate signal decreases, the voltage of the first sub-source region decreases.

7. The pixel circuit of claim 6, wherein, when the voltage of the first sub-source region increases, a voltage of the first gate electrode increases, and an increase amount of the voltage of the first gate electrode is less than an increase amount of the voltage of the first sub-source region, and wherein, when the voltage of the first sub-source region decreases, the voltage of the first gate electrode decreases, and a decrease amount of the first gate electrode is less than an decrease amount of the voltage of the first sub-source region.

8. The pixel circuit of claim 1, wherein, when the third gate signal applied to the third and fourth sub-gate electrodes increases, a voltage of the third sub-source region increases, and wherein, when the third gate signal decreases, the voltage of the third sub-source region decreases.

9. The pixel circuit of claim 8, wherein, when the voltage of the third sub-source region increases, a voltage of the first gate electrode increases, and an increase amount of the voltage of the first gate electrode is less than an increase amount of the voltage of the third sub-source region, and wherein, when the voltage of the third sub-source region decreases, the voltage of the first gate electrode decreases, and an decrease amount of the voltage of the first gate electrode is less than an decrease amount of the voltage of the third sub-source region.

10. A pixel circuit, comprising:
a light emitting element including an anode and a cathode;
a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region;
a first sub-transistor including a first sub-source region electrically connected to a second sub-drain region, a first sub-drain region electrically connected to the first gate electrode, a first sub-channel region disposed between the first sub-source region and the first sub-drain region, and a first sub-gate electrode overlapping the first sub-channel region;
a second sub-transistor including a second sub-source region electrically connected to the first drain region, the second sub-drain region electrically connected to the first sub-source region, a second sub-channel region disposed between the second sub-source region and the second sub-drain region, and a second sub-gate electrode overlapping the second sub-channel region;
a storage capacitor including a first storage electrode electrically connected to the first gate electrode and a second storage electrode electrically connected to the first power supply voltage line; and
a first hold capacitor including a first hold electrode electrically connected to the first sub-source region and a second hold electrode electrically connected to the first gate electrode, wherein an active layer includes:
- the first source region, the first drain region, and the first channel region;
- the first sub-source region, the first sub-drain region, and the first sub-channel region;
- the second sub-source region, the second sub-drain region, and the second sub-channel region; and
- the first hold electrode, and wherein a conductive layer is disposed on the active layer and includes the first gate electrode, the first sub-gate electrode, the second sub-gate electrode, and the second hold electrode.

11. The pixel circuit of claim 10, wherein a frame period in which the pixel circuit is driven includes a threshold voltage compensating period for compensating a threshold voltage of the first transistor, and wherein, during the threshold voltage compensating period, the first sub-transistor and the second sub-transistor are turned on in response to a second gate signal.

12. The pixel circuit of claim 10, wherein a voltage of the first gate electrode is boosted by the first hold capacitor.

13. The pixel circuit of claim 10, wherein a boosting voltage of the first gate electrode is determined by a series connection of the storage capacitor and the first hold capacitor.

14. The pixel circuit of claim 10, wherein, when a second gate signal applied to the first and second sub-gate electrodes increases, a voltage of the first sub-source region increases, and wherein, when the second gate signal decreases, the voltage of the first sub-source region decreases.

15. The pixel circuit of claim 14, wherein, when the voltage of the first sub-source region increases, a voltage of the first gate electrode increases, and an increase amount of the voltage of the first gate electrode is less than an increase amount of the voltage of the first sub-source region, and wherein, when the voltage of the first sub-source region decreases, the voltage of the first gate electrode decreases, and a decrease amount of the first gate electrode is less than an decrease amount of the voltage of the first sub-source region.

16. A pixel circuit, comprising:

a light emitting element including an anode and a cathode;

a first transistor including a first source region electrically connected to a first power supply voltage line which transfers a first power supply voltage, a first drain region electrically connected to the anode, a first channel region disposed between the first source region and the first drain region, and a first gate electrode overlapping the first channel region;

a third sub-transistor including a third sub-source region electrically connected to a fourth sub-drain region, a third sub-drain region electrically connected to the first gate electrode, a third sub-channel region disposed between the third sub-source region and the third sub-drain region, and a third sub-gate electrode overlapping the third sub-channel region;

a fourth sub-transistor including a fourth sub-source region electrically connected to a first initialization voltage line which transfers a first initialization voltage, the fourth sub-drain region electrically connected to the third sub-source region, a fourth sub-channel region disposed between the fourth sub-source region and the fourth sub-drain region, and a fourth sub-gate electrode overlapping the fourth sub-channel region;

a storage capacitor including a second storage electrode electrically connected to the first gate electrode and a second storage electrode electrically connected to the first power supply voltage line; and a second hold capacitor including a third hold electrode electrically connected to the third sub-source region and a fourth hold electrode electrically connected the first gate electrode, wherein an active layer includes:

the first source region, the first drain region, and the first channel region;

the third sub-source region, the third sub-drain region, and the third sub-channel region;

the fourth sub-source region, the fourth sub-drain region, and the fourth sub-channel region; and the third hold electrode, and wherein a conductive layer is disposed on the active layer and includes the first gate electrode, the third sub-gate electrode, the fourth sub-gate electrode, and the fourth hold electrode.

17. The pixel circuit of claim 16, wherein a frame period in which the pixel circuit is driven includes an initialization period in which the first gate electrode is initialized, and wherein, during the initialization period, the third sub-transistor and the fourth sub-transistor are turned on in response to a third gate signal.

18. The pixel circuit of claim 16, wherein a voltage of the first gate electrode is boosted by the second hold capacitor.

19. The pixel circuit of claim 16, wherein a boosting voltage of the first gate electrode is determined by a series connection of the storage capacitor and the second hold capacitor.

20. The pixel circuit of claim 16, wherein, when the third gate signal applied to the third and fourth sub-gate electrodes increases, a voltage of the third sub-source region increases, a voltage of the first gate electrode increases, and an increase amount of the voltage of the first gate electrode is less than an increase amount of the voltage of the third sub-source region, and wherein, when the third gate signal decreases, the voltage of the third sub-source region decreases, the voltage of the first gate electrode decreases, and an decrease amount of the voltage of the first gate electrode is less than an decrease amount of the voltage of the third sub-source region.

* * * * *